US007180355B2

(12) United States Patent
Teraishi

(10) Patent No.: US 7,180,355 B2
(45) Date of Patent: Feb. 20, 2007

(54) LEVEL SHIFTER CIRCUIT WITH STRESS TEST FUNCTION

(75) Inventor: Toshio Teraishi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 115 days.

(21) Appl. No.: 10/944,862

(22) Filed: Sep. 21, 2004

(65) Prior Publication Data

US 2005/0280461 A1 Dec. 22, 2005

(30) Foreign Application Priority Data

Jun. 21, 2004 (JP) ............................. 2004-182130

(51) Int. Cl.
*H03L 5/00* (2006.01)
(52) U.S. Cl. ........................... 327/333; 326/68; 326/81
(58) Field of Classification Search ................ 327/333; 326/63, 68, 80, 81
See application file for complete search history.

(56) References Cited

U.S. PATENT DOCUMENTS 5,473,567 A * 12/1995 McClure ..................... 365/208
6,633,192 B2 10/2003 Tsuchiya ..................... 327/333
2002/0153934 A1* 10/2002 Yoon .......................... 327/333
2004/0227557 A1* 11/2004 Ishikawa et al. ............ 327/333

FOREIGN PATENT DOCUMENTS

JP 2002-084184 3/2002

* cited by examiner

*Primary Examiner*—Quan Tra
(74) *Attorney, Agent, or Firm*—Nixon Peabody LLP; Donald R. Studebaker

(57) ABSTRACT

A level shifter circuit includes first and second reference potential supply lines; first and second output potential supply circuits each connected between the first and second reference potential supply lines; first and second input lines; first and second output lines; and a stress test circuit which functions to, during normal operation, when the first input signal and the second input signal are input to the first input line and the second input line, output the first output signal and the second output signal having respectively different potentials for the first output line and the second output line, and during the stress test, when the first input signal and the second input signal are input to the first input line and the second input line, output signals having identical potentials from the first output line and the second output line.

5 Claims, 20 Drawing Sheets

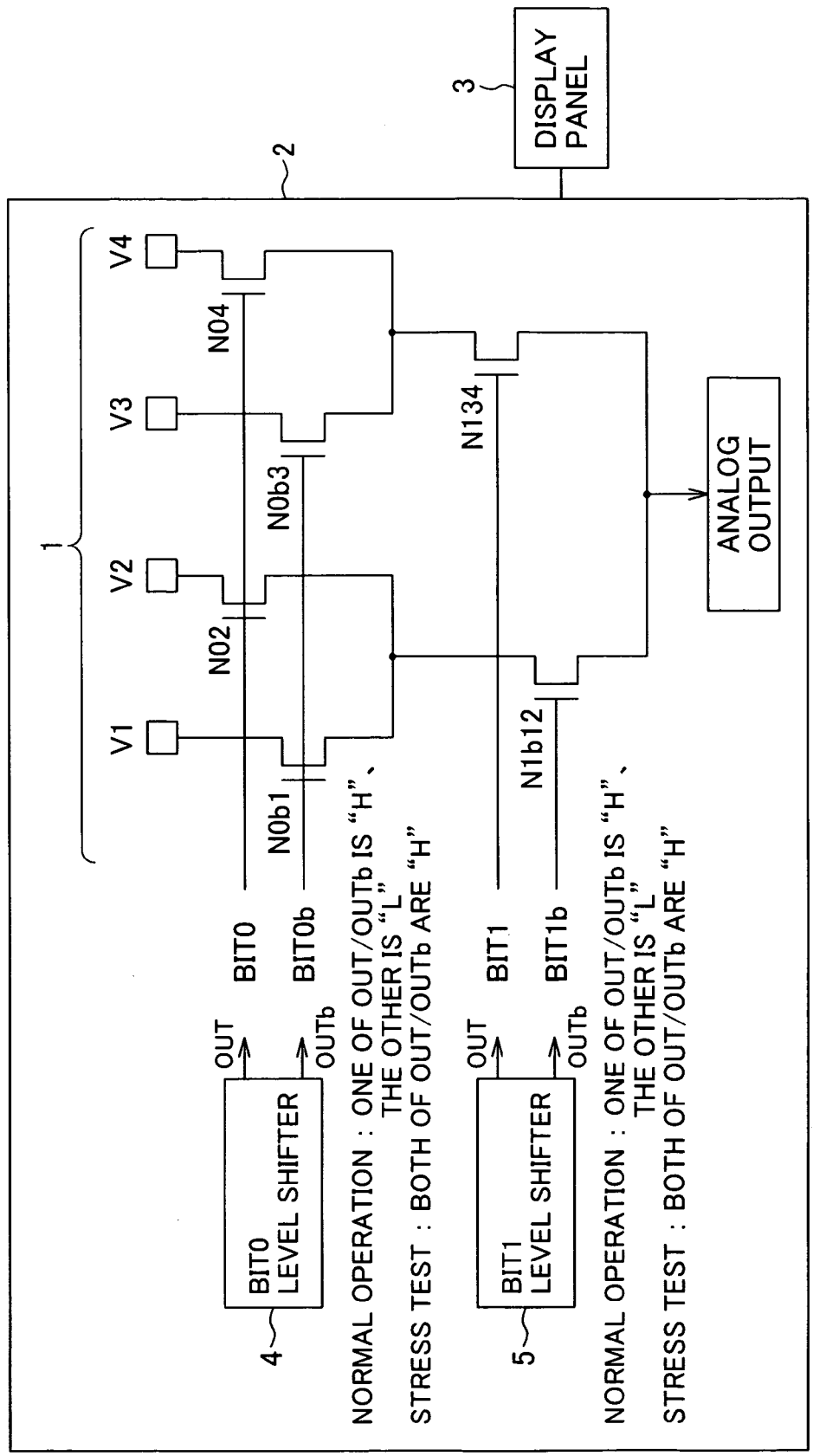

FIG.1B

| OUTPUT GRADATION | STRESS TEST | | | | |
|---|---|---|---|---|---|
| | BIT1 | BIT1b | BIT0 | BIT0b | ON-STATE TRANSISTORS |
| ANY ONE OF V1,V2,V3 AND V4 | H | H | H | H | N0b1,N02,N0b3,N04, N1b12,N134 |

100% Duty (applies to BIT1, BIT1b, BIT0, BIT0b, ON-STATE TRANSISTORS)

| NORMAL OPERATION | | | | |
|---|---|---|---|---|
| DAC | IN | INb | OUT | OUTb |
| BITn ON | H | L | H | L |
| BITnb ON | L | H | L | H |

| NORMAL OPERATION | | | | |
|---|---|---|---|---|
| DAC | IN | INb | OUT | OUTb |
| BITn ON | H | L | H | L |
| ⇒ BITnb ON | L | H | L | H |

| STRESS TEST | | | | |
|---|---|---|---|---|
| DAC | IN | INb | OUT | OUTb |
| BITn&BITnb ON | H | L | H | H |
| BITn&BITnb ON | — | — | — | — |

| | NORMAL OPERATION | | | | | |
|---|---|---|---|---|---|---|
| | DAC | TESTb | IN | INb | OUT | OUTb |
| ⇒ | BITn ON | H | H | L | H | L |
| | BITnb ON | H | L | H | L | H |

| NORMAL OPERATION | | | | | |
|---|---|---|---|---|---|
| DAC | TESTb | IN | INb | OUT | OUTb |
| BITn ON | H | H | L | H | L |
| ⇨ BITnb ON | H | L | H | L | H |

| STRESS TEST | | | | | |
|---|---|---|---|---|---|
| DAC | TESTb | IN | INb | OUT | OUTb |
| BITn&BITnb ON | L | H | L | H | H |
| BITn&BITnb ON | L | L | H | H | H |

| NORMAL OPERATION | | | | | |
|---|---|---|---|---|---|
| DAC | TEST | IN | INb | OUT | OUTb |
| BITn ON | L | H | L | H | L |
| BITnb ON | L | L | H | L | H |

| NORMAL OPERATION | | | | | | |
|---|---|---|---|---|---|---|
| DAC | TEST | IN | INb | OUT | OUTb |
| BITn ON | L | H | L | H | L |
| ⇒ BITnb ON | L | L | H | L | H |

| STRESS TEST | | | | | |
|---|---|---|---|---|---|
| DAC | TEST | IN | INb | OUT | OUTb |
| BITn&BITnb ON | H | H | L | L | L |
| BITn&BITnb ON | H | L | H | L | L |

| NORMAL OPERATION | | | | | |
|---|---|---|---|---|---|
| DAC | TEST | IN | INb | OUT | OUTb |
| BITn ON | L | H | L | H | L |
| BITnb ON | L | L | H | L | H |

| NORMAL OPERATION | | | | | |
|---|---|---|---|---|---|
| DAC | TEST | IN | INb | OUT | OUTb |
| BITn ON | L | H | L | H | L |
| BITnb ON | L | L | H | L | H |

| STRESS TEST | | | | | |
|---|---|---|---|---|---|
| DAC | TEST | IN | INb | OUT | OUTb |
| BITn&BITnb ON | H | H | L | H | H |
| BITn&BITnb ON | H | L | H | H | H |

| NORMAL OPERATION | | | | | |
|---|---|---|---|---|---|
| N-DAC | TEST | IN | INb | OUT | OUTb |
| BITn ON | L | H | L | H | L |
| BITnb ON | L | L | H | L | H |

| NORMAL OPERATION | | | | | |
|---|---|---|---|---|---|
| N-DAC | TEST | IN | INb | OUT | OUTb |
| BITn ON | L | H | L | H | L |
| ⇒ BITnb ON | L | L | H | L | H |

| STRESS TEST | | | | | |
|---|---|---|---|---|---|
| N-DAC | TEST | IN | INb | OUT | OUTb |
| BITn&BITnb ON | H | H | L | L | L |
| BITn&BITnb ON | H | L | H | L | L |

FIG.17B PRIOR ART

| OUTPUT GRADATION | STRESS TEST | | | | |
|---|---|---|---|---|---|
| | BIT1 | BIT1b | BIT0 | BIT0b | ON-STATE TRANSISTORS |
| V4 | H | L | H | L | N02,N04,N134 |
| V3 | H | L | L | H | N0b1,N0b3,N134 |
| V2 | L | H | H | L | N02,N04,N1b12 |
| V1 | L | H | L | H | N0b1,N0b3,N1b12 |

1/2 Duty (BIT0, BIT0b columns)

| DAC | IN | INb | OUT | OUTb |
|---|---|---|---|---|
| BITn ON | H | L | H | L |
| BITnb ON | L | H | L | H |

LEVEL SHIFTER CIRCUIT WITH STRESS TEST FUNCTION

BACKGROUND OF THE INVENTION

1. Field of the Invention

The present invention relates to a level shifter circuit having a screening test function which efficiently destroys latent manufacturing defects which lead to initial failures after shipping, such as in a gradation selection circuit which selects and outputs one of plural analog gradation voltages, to a drive circuit in which the level shifter circuit is installed, to a display in which the drive circuit is installed, and to a stress test method for the gradation selection circuit.

2. Description of the Related Art

A high voltage stress test is a general method for screening the initial failure of a display drive LSI. This high voltage stress test is a test method which, in the stress test before shipping, applies a voltage higher than the LSI drive voltage applied to the LSI in use, and thus reveals latent element defects in the LSI more effectively (i.e., latently defective parts are destroyed prior to shipping). The high voltage stress test time is determined by taking account of a voltage acceleration component (i.e., how much the revealing of an element defect is accelerated by applying a voltage), and a temperature acceleration component (how much the revealing of an element defect is accelerated by temperature), estimating the initial market failure rate, and setting a target failure rate according to the application of the LSI and the specification required of the LSI so that the initial failure rate is less than the target failure rate.

In recent microfabrication wafer processes, high voltage-resisting elements which can apply a high voltage such as 16 V have become indispensable, and it is important to screen for latent defects which could lead to the initial failure of these elements by a high voltage stress test. In order to maximize the test coverage of such screening, a full gradation scan test of the gradation selection circuit used for the display drive (generally, a digital analog converter (DAC)) must be performed.

FIG. 17A shows the construction of prior-art level shifter circuits 604 and 605 and gradation selection circuit 601, and FIG. 17B shows the operating state of the level shifter circuits 604 and 605 during a prior-art stress test.

The gradation selection operation of the gradation selection circuit 601 will first be described using FIG. 17A. The level shifter circuit 604 applies a control signal BIT0$b$ from an output terminal OUTb to the gates N0b1 and N0b3 of an NMOS transistor N0$b$1 of the gradation selection circuit 601. The level shifter circuit 604 also applies a control signal BIT0 from the output terminal OUT to the gates of the NMOS transistors N02 and N04 of the gradation selection circuit 601. The control signal BIT0$b$ is a signal which is the logical reverse of the control signal BIT0, therefore, one of the control signals BIT0 and BIT0$b$ is H (high) level, and the other is L (low) level. The level shifter circuit 605 applies a control signal BIT1$b$ from the output terminal OUTb to the gate of the NMOS transistor N1$b$12 of the gradation selection circuit 601. The level shifter circuit 605 applies a control signal BIT1 from the output terminal OUT to the gate of the NMOS transistor N134 of the gradation selection circuit 601. The control signal BIT1$b$ is a signal which is the logical reverse of the control signal BIT1, therefore, one of the control signals BIT1 and BIT1$b$ is H level, and the other is L level. By controlling the gradation selection circuit 601 by the level shifter circuits 604 and 605, one of the analog gradation voltages V1–V4 is output from the gradation selection circuit 601.

FIG. 18A shows the construction of the prior-art level shifter circuit 700 (the level shifter circuit 604 or 605 in FIG. 17A), and FIG. 18B shows the operating state of the level shifter circuit 700 during a prior-art stress test.

As shown in FIG. 18A, the level shifter circuit 700 has a first reference potential supply line 701 to which an L level (GND) potential (or voltage) is applied, a second reference potential supply line 702 to which an H level potential (or voltage) is applied, a first PMOS transistor 711 and first NMOS transistor 712 connected in series sequentially from the second reference potential supply line 702 side, a second PMOS transistor 721 and second NMOS transistor 722 connected in series sequentially from the second reference potential supply line 702 side, a first connection line 714 which connects a gate 715 of the first PMOS transistor 711 to a drain 723 of the second NMOS transistor 722, and a second connection line 724 which connects a gate 725 of the second PMOS transistor 721 to a drain 713 of the first NMOS transistor 712. As shown in FIG. 18A, the level shifter circuit 700 further has a first input line 731 connected to the gate of the first NMOS transistor 712 into which a first input signal IN is input, a second input line 732 connected to the gate of the second NMOS transistor 722 into which a second input signal INb (i.e., a signal which is the logical reverse of the first signal IN) is input, a first output line 741 connected to the drain 713 of the first NMOS transistor 712 which outputs a first output signal (i.e., a control signal which controls the gradation selection circuit) BITnb (n=0, 1, . . . ), and a second output line 742 connected to the drain 723 of the second NMOS transistor 722 which outputs a second output signal (i.e., a control signal which controls the gradation selection circuit) BITn (n=0, 1, . . . ). The prior-art level shifter circuit is disclosed, for example, by Japanese Patent Kokai (Laid-Open) Publication No. 2002-84184.

Next, the stress test method of the gradation selection circuit (four gradations (2-BIT gradation) DAC) 601 of FIG. 17A will be described. To apply the test voltage to all six NMOS transistors shown in FIG. 17A, N0$b$1, N02, N0$b$3, N04, N134 and N1$b$12, it is necessary to perform a high voltage stress test with all four patterns of the four gradations of the analog output voltages V1–V4. This is because, to destroy the latently defective parts in the NMOS transistors N02 and N04 and the NMOS transistors N0$b$1 and N0$b$3 which are controlled by the control signal BIT0 or BIT0$b$, these four NMOS transistors must be switched ON, and to destroy the latently defective parts in the NMOS transistors N134 and N1$b$12 which are controlled by the control signal BIT1 or BIT1$b$, these two NMOS transistors must be switched ON. For example, in an n-BIT gradation DAC, the number of transistors is $(2^1+2^2+2^3+ \ldots +2^n)$. Therefore, in an 8-BIT gradation DAC, the number of transistors per output is 510, and in an 8-BIT gradation 642 output DAC, the number of transistors is 510×642=327,420. Also, in order to apply a high voltage stress to the $(2^1+2^2+2^3+ \ldots +2^n)$ transistors, $2^n$ patterns must be tested.

However, in flat panel displays which display digital images or television, etc., in recent years, higher gradation displays, finer displays and display drive LSI with multiple outputs (increase in drive outputs) have come into demand. For example, the source electrode drive LSI for TFT liquid crystal panels have shifted from a 6-BIT gradation (about 260,000 colors) to an 8-BIT gradation (about 16,780,000 colors), moreover, trials are now being performed on a 10-BIT gradation (about 1 billion colors), and even higher gradations are expected to be realized in future. As regards the number of drive outputs of display drive LSI, in addition to the usual 384 outputs, 480 outputs, 642 outputs and even more outputs have come into practical use. To increase display contrast, there is a trend to increase the display drive voltage and LSI power supply voltage. Moreover, to provide the multiple gradations and multiple outputs of display drive LSI, there is a need for display drive LSI with very large-scale integrated circuits, and in costly display devices such as large televisions it is a matter of particular importance to reduce the initial failure rate.

However, in a prior-art level shifter circuit which controls the transistor of a DAC forming a gradation selection circuit, as shown in FIG. 18B, there are only two combinations of the output signals OUT (BIT0, BIT1) and OUTb (BIT0b, BIT1b) with the input signals IN and INb (output signal OUT is H level and OUTb is L level, or output signal OUT is L level and OUTb is H level), so a very large number of stress test patterns had to be input, and the stress test time was very long.

SUMMARY OF THE INVENTION

It is therefore an object of the present invention to provide a level shifter circuit which can efficiently perform a stress test on a controlled circuit such as a gradation selection circuit.

A level shifter circuit, wherein a circuit which turns on when a first reference potential is input as a control potential is used as a first-type switching circuit, and a circuit which turns on when a second reference potential different from the first reference potential is input, is used as a second-type switching circuit, the level shifter circuit includes: a first reference potential supply line to which a first reference potential is applied; a second reference potential supply line to which a second reference potential different from the first reference potential is applied; a first output potential supply circuit including a first first-type switching circuit and a first second-type switching circuit connected sequentially in series from the second reference potential supply line side, the first output potential supply circuit being connected between the first reference potential supply line and the second reference potential supply line; a second output potential supply circuit including a second first-type switching circuit and a second second-type switching circuit connected sequentially in series from the second reference potential supply line side, the second output potential supply circuit being connected between the first reference potential supply line and the second reference potential supply line, the second output potential supply circuit being connected in parallel with the first output potential supply circuit between the first reference potential supply line and the second reference potential supply line; a first connection line which supplies a potential between the second first-type switching circuit and the second second-type switching circuit to a control terminal of the first first-type switching circuit; a second connection line which supplies a potential between the first first-type switching circuit and the first second-type switching circuit to a control terminal of the second first-type switching circuit; a first input line which supplies a first input signal to a control terminal of the first second-type switching circuit; a second input line which supplies a second input signal to a control terminal of the second second-type switching circuit; a first output line which outputs a potential between the first first-type switching circuit and the first second-type switching circuit as a first output signal; a second output line which outputs a potential between the second first-type switching circuit and the second second-type switching circuit as a second output signal; and a stress test circuit which changes over the first output signal and the second output signal output to a controlled circuit from the first output line and the second output line, to any one of a signal when the controlled circuit is operating normally and a signal when the controlled circuit is subjected to a stress test. The stress test circuit functions to: during normal operation, when the first input signal and the second input signal having respectively different potentials are input to the first input line and the second input line, output the first output signal and the second output signal having respectively different potentials for the first output line and the second output line, and during the stress test, when the first input signal and the second input signal having respectively different potentials are input to the first input line and the second input line, output signals having identical potentials from the first output line and the second output line.

According to the present invention, a signal having the same potential can be output from both the first output line and second output line during a stress test, so the stress test of the controlled circuit such as a gradation selection circuit can be efficiently performed.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 1A shows level shifter circuits and the construction of a gradation selection circuit in accordance with a first, second and fourth embodiment of the present invention, and FIG. 1B shows operating state of the level shifter circuits and the gradation selection circuit during a stress test;

FIG. 17B shows operating state of the prior-art level shifter circuits and the gradation selection circuit during a stress test.

DETAILED DESCRIPTION OF THE INVENTION

Figures 2A, 2B:
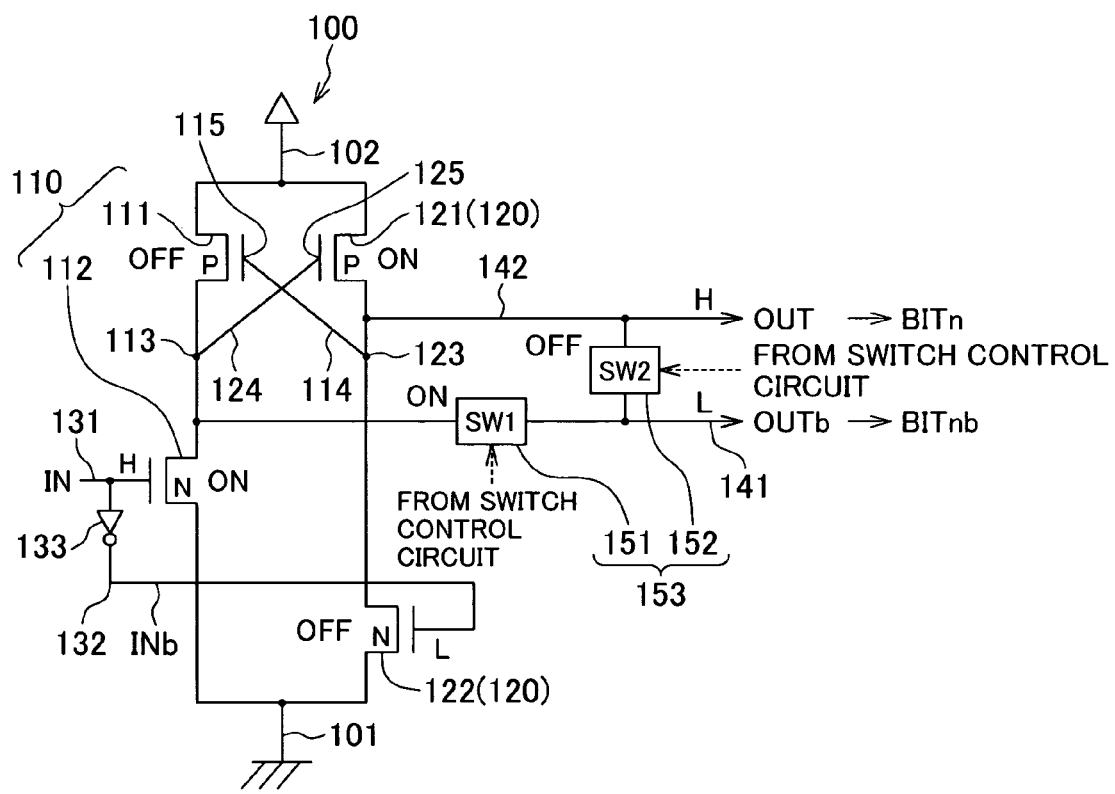
FIG. 2A shows the construction and operating state during gradation selecting operation of a level shifter circuit in accordance with the first embodiment of the present invention.
FIG. 2B shows the operating state of the level shifter circuit during a gradation selecting operation.

Further scope of applicability of the present invention will become apparent from the detailed description given hereinafter. However, it should be understood that the detailed description and specific examples, while indicating preferred embodiments of the invention, are given by way of illustration only, since various changes and modifications will become apparent to those skilled in the art from the detailed description.

FIG. 1A shows level shifter circuits in accordance with first, second and fourth embodiments of the present invention, and the construction of a gradation selection circuit functioning as a controlled circuit controlled by these level shifter circuits, and FIG. 1B shows the operating state of the level shifter circuits and the gradation selection circuit during a stress test. In FIG. 1A, a drive circuit 2 is a circuit which drives a display panel (e.g., a liquid crystal panel) 3 of a display (e.g., a liquid crystal display apparatus), and it has level shifter circuits 4 and 5 and a gradation selection circuit 1. The controlled circuit which is controlled by the level shifter circuit of the present invention is not limited to the gradation selection circuit shown in FIGS. 1A and 1B, but may also be a circuit of different construction. For example, the gradation selection circuit driven by the level shifter circuit of the third and fifth embodiments of the present invention has a construction wherein the NMOS transistors shown in FIG. 1A are replaced by PMOS transistors.

First, referring to FIG. 1A, a gradation selection operation of the gradation selection circuit 1 will be described. The level shifter circuit 4 applies a control signal BIT0b from the output terminal OUTb to the gates of the NMOS transistors N0b1 and N0b3 of the gradation selection circuit 1. The level shifter circuit 4 also applies a control signal BIT0 from the output terminal OUT to the gates of the NMOS transistors N02 and N04 of the gradation selection circuit 1. The control signal BIT0b is a signal which is the logical reverse of the control signal BIT0, therefore, one of the control signals BIT0 and BIT0b is H (high) level and the other is L (low) level. The level shifter circuit 5 applies a control signal BIT1b from the output terminal OUTb to the gate of the NMOS transistor N1b12 of the gradation selection circuit 1. The level shifter circuit 5 also applies a control signal BIT1 from the output terminal OUT to the gate of the NMOS transistor N134 of the gradation selection circuit 1. The control signal BIT1b is a signal which is the logical reverse of the control signal BIT1, therefore, one of the control signals BIT1 and BIT1b is H level and the other is L level. From the gradation selection circuit 1, any of the input analog gradation voltages V1–V4 is output by controlling the gradation selection circuit 1 by the level shifter circuits 4 and 5.

Next, the stress test method of the gradation selection circuit (four gradation (2-BIT gradation) DAC) 1 shown in FIG. 1A will be described. In order to apply a stress test voltage to all six NMOS transistors shown in FIG. 1A, it is necessary to perform a high voltage stress test with the four patterns of all four gradations of the analog output voltages V1–V4. This is because to destroy the latently defective parts in the NMOS transistors N02 and N04 and the NMOS transistors N0b1 and N0b3 which are controlled by the control signal BIT0 or BIT0b, these four NMOS transistors must be switched ON, and to destroy the latently defective parts in the NMOS transistors N134 and N1b12 which are controlled by the control signal BIT1 or BIT1b, these two NMOS transistors must be switched ON. Further, during a stress test, a gradation voltage other than one arbitrary output gradation (one of V1–V4) is arranged to be floating, or the same potential is applied to all the output gradation voltages V1–V4.

First Embodiment

Figures 3A, 3B:
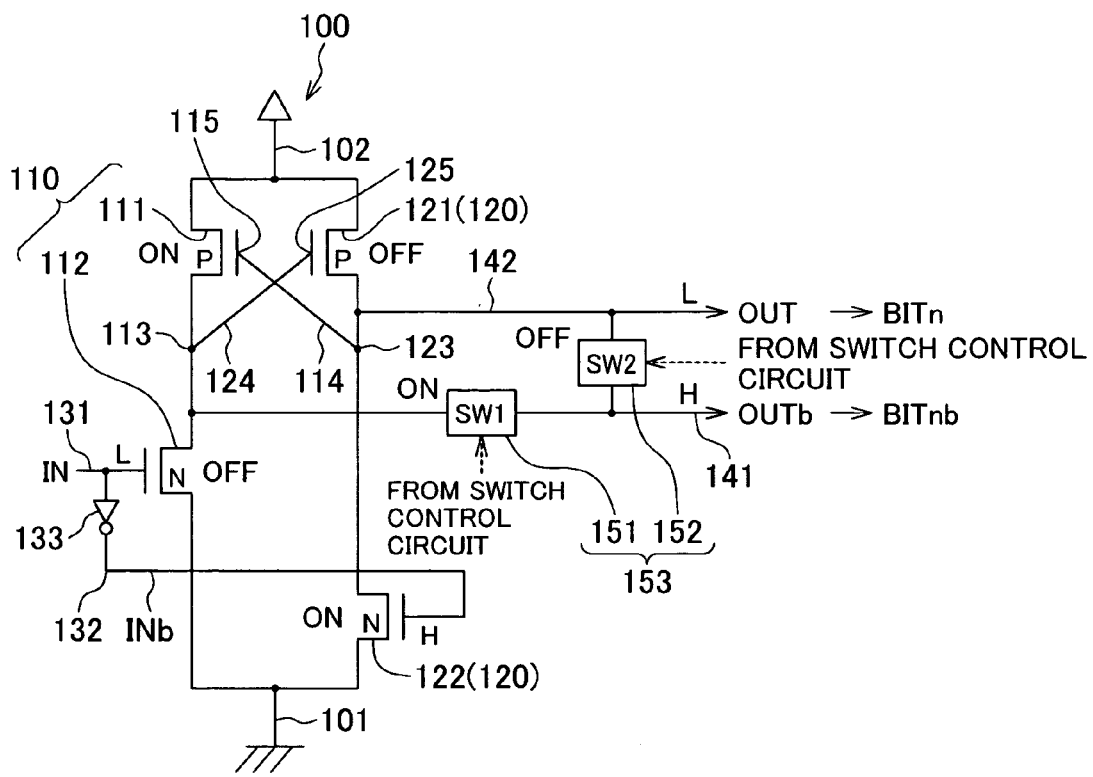
FIG. 3A shows the construction and operating state during a gradation selecting operation of a level shifter circuit in accordance with the first embodiment of the present invention.
FIG. 3B shows the operating state of the level shifter circuit during a gradation selecting operation.
Figures 4A, 4B:
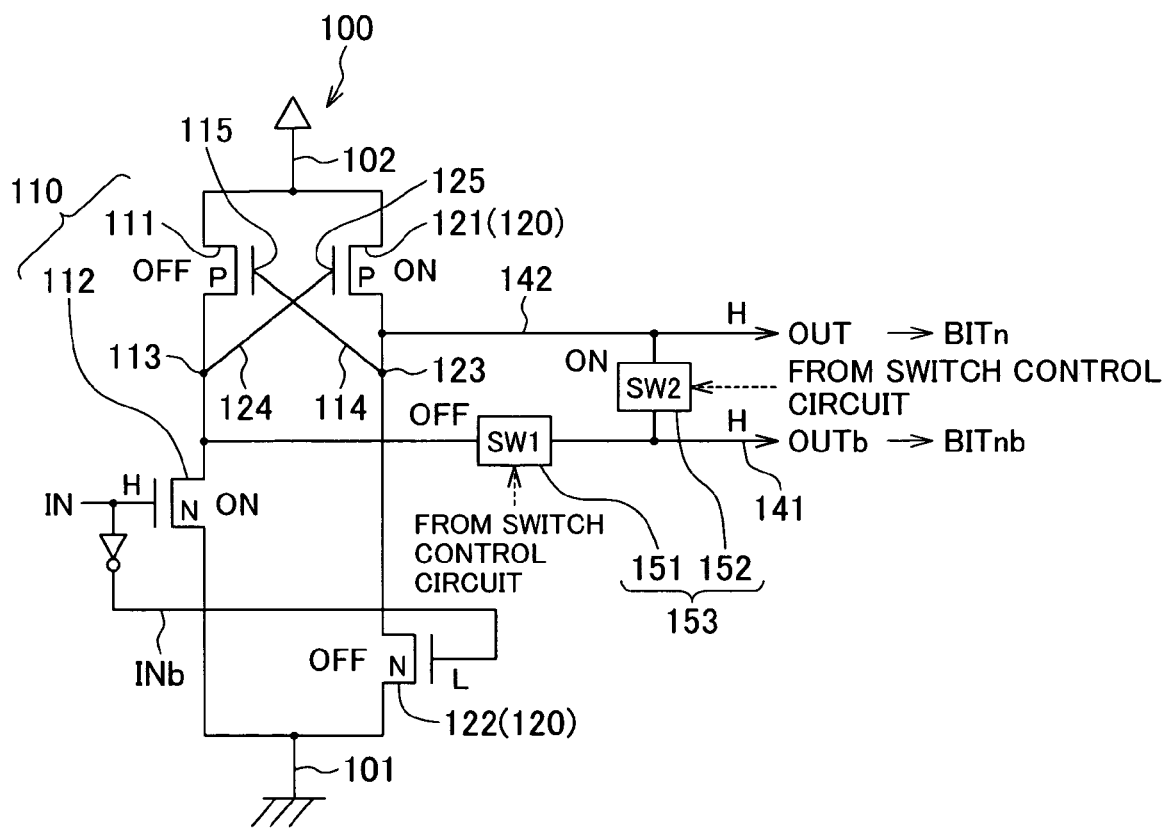
FIG. 4A shows the construction and operating state during a stress test of a level shifter circuit in accordance with the first embodiment of the present invention.
FIG. 4B shows the operating state of the level shifter circuit during a stress test.

FIG. 2A shows the construction and operating state during normal operation (i.e., during a gradation selection operation) of a level shifter circuit 100 in accordance with the first embodiment of the present invention, and FIG. 2B shows the operating state during normal operation of the level shifter circuit 100. Further, FIG. 3A shows the construction and operating state during normal operation of the level shifter circuit 100 in accordance with the first embodiment of the present invention, and FIG. 3B shows the operating state during normal operation of the level shifter circuit 100. Furthermore, FIG. 4A shows the construction and operating state during a stress test of the level shifter circuit 100 in accordance with the first embodiment of the present invention, and FIG. 4B shows the operating state of the level shifter circuit 100 during the stress test.

As shown in FIGS. 2A, 2B, 3A, 3B, 4A and 4B, the level shifter circuit 100 has a first reference potential supply line 101 to which a first reference potential (e.g., a ground potential GND) is applied, a second reference potential supply line 102 to which a different second reference potential (e.g., a potential having a larger absolute value than the ground potential) from the first reference potential is applied, a first output potential supply circuit 110 connected between the first reference potential supply line 101 and the second reference potential supply line 102, and a second output potential supply circuit 120 connected between the first reference potential supply line 101 and the second reference potential supply line 102 in parallel with the first output potential supply circuit 110. The first output potential supply circuit 110 has a first PMOS transistor 111 and a first NMOS transistor 112 which are connected in series sequentially from the second reference potential supply line 102 side. The second output potential supply circuit 120 has a second PMOS transistor 121 and a second NMOS transistor 122 which are connected in series sequentially from the second reference potential supply line 102 side.

The level shifter circuit 100 has a first connection line 114 which connects a gate 115 of the first PMOS transistor (i.e., P-channel transistor) 111 and a drain 123 of the second NMOS transistor (i.e., N-channel transistor) 122 (i.e., a node between a source of the second PMOS transistor 121 and a drain of the second NMOS transistor 122), and a second connection line 124 which connects a gate 125 of the second PMOS transistor 121 and a drain 113 of the first NMOS transistor 112 (i.e., a node between a source of the first PMOS transistor 111 and a drain of the second NMOS transistor 112).

The level shifter circuit 100 has a first input line 131 connected to the gate of the first NMOS transistor 112 into which the first input signal IN is input, a second input line 132 connected to the gate of the second NMOS transistor 122 into which the second input signal INb, which is the logical reverse of the first input signal IN is input, and an inverter 133 for generating the second input signal INb from the first input signal IN. The inverter 133 is not necessarily a part of the level shifter circuit 100, and may be a part of a control circuit, not shown, which supplies the input signal to the level shifter circuit 100. The level shifter circuit 100 further has a first output line 141 connected to the drain 113 of the first NMOS transistor 112 (i.e., a node between the source of the first PMOS transistor 111 and the drain of the second NMOS transistor 112), which outputs the first output signal OUTb, and a second output line 142 connected to the drain 123 of the second NMOS transistor 122 (i.e., a node between the source of the second PMOS transistor 121 and the drain of the second NMOS transistor 122), which outputs the second output signal OUT.

The level shifter circuit 100 has a first switch (SW1) 151 which changes over between connection and disconnection of two nodes, wherein one node is the node 113 between the first NMOS transistor 111 and the first PMOS transistor 112, and the other node is the output terminal of the first output line 141. The level shifter circuit 100 also has a second switch (SW2) 152 which changes over between connection and disconnection of two nodes, wherein one node is a point downstream (on the output end side) from the first switch 151 in the first output line 141, and the other node is a node on the second output line 142. A stress test circuit 153 for the stress test of the controlled device (e.g., the gradation selection circuit (DAC) 1 shown in FIG. 1A) includes the first switch 151 and the second switch 152. The first switch 151 and the second switch 152 are switched ON and OFF by a control signal from a switch control circuit, not shown. The first switch 151 can also be provided not on the first output line 141 but on the second output line 142.

As shown in FIGS. 2A, 2B, 3A and 3B, during normal operation, i.e., during a gradation selection operation, the first switch 151 is ON and the second switch 152 is OFF, and the first input signal IN input into the first input line 131 is set to H level (FIGS. 2A and 2B) or L level (FIGS. 3A and 3B).

As shown in FIGS. 2A and 2B, if the first input signal IN is set to H level, the second input signal INb will be L level. At this time, the first NMOS transistor 112 is ON, the node 113 is L level, and the second PMOS transistor 121 is ON. In addition, the second NMOS transistor 122 is OFF, the node 123 is H level and the first PMOS transistor 115 is OFF. As a result, the first output OUTb of the first output line 141 connected to the node 113 is L level and the second output OUT of the second output line 142 connected to the node 123 is H level.

As shown in FIGS. 3A and 3B, if the first input signal IN is set to L level, the second input signal INb will be H level. At this time, the first NMOS transistor 112 is OFF, the node 113 is H level, and the second PMOS transistor 121 is OFF. In addition, the second NMOS transistor 122 is ON, the node 123 is L level, and the first PMOS transistor 115 is ON. As a result, the first output OUTb of the first output line 141 connected to the node 113 is H level, and the second output OUT of the second output line 142 connected to the node 123 is L level.

As shown in FIGS. 4A and 4B, during a stress test, the first switch 151 is set to OFF, the second switch 152 is set to ON, the first input signal IN which is input to the first input line 131 is set to H level, and the second input signal INb is set to L level. At this time, the first NMOS transistor 112 is ON, the node 113 is L level, and the second PMOS transistor 121 is ON. In addition, the second NMOS transistor 122 is OFF, the node 123 is H level, and the first PMOS transistor 115 is OFF. As a result, the second output OUT of the second output line connected to the node 123 is H level, and the second output OUT of the second output line connected to the node 123 by the second switch 152 is also H level.

When the gradation selection circuit 1 is formed from N-channel transistors, all the N-channel transistors of the gradation selection circuit 1 can be switched ON by performing the stress test shown in FIGS. 4A and 4B. If the gradation selection circuit 1 consists of P-channel transistors, the first input signal IN is set to L level, the second input signal INb is set to H level, and both the first output signal OUTb and the second output signal OUT are set to L level, then all the P-channel transistors of the gradation selection circuit 1 can be switched ON.

As described above, in the level shifter circuit 100 in accordance with the first embodiment, the drive circuit 2 in which this level shifter circuit 100 is installed, the display device in which the drive circuit 2 is installed, and the stress test method for the gradation selection circuit 1 using the level shifter circuit 100, all the transistors in the gradation selection circuit 1 subjected to the stress test can be simultaneously switched ON, so a high voltage stress test can be performed efficiently. More specifically, when a stress voltage is applied as the gradation voltages V1–V4, the duty ratio which is the ratio of the ON period of the transistors to the test time is 100% even if all stress voltage patterns are tested, so the efficiency of the high voltage stress test is a maximum.

Second Embodiment

Figures 5A, 5B:
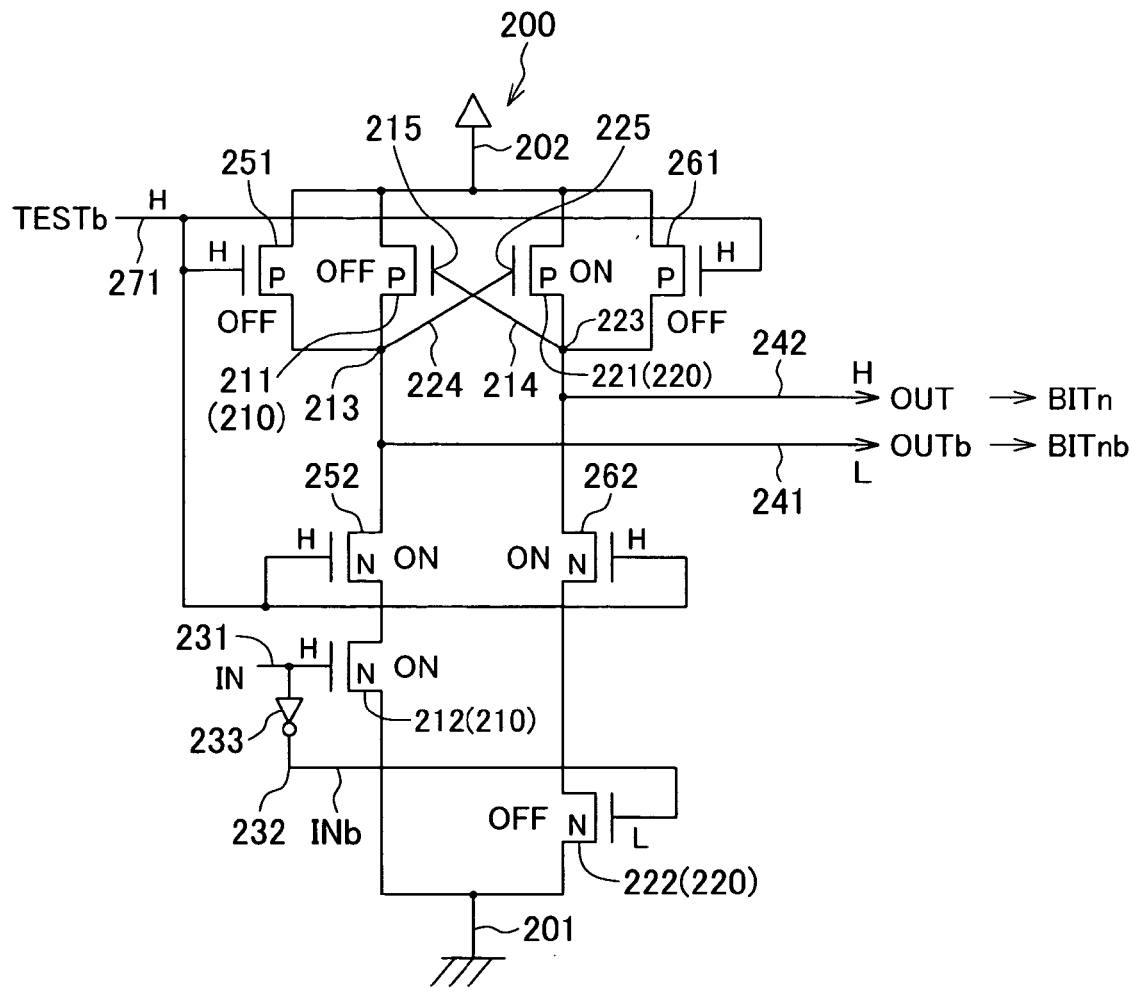
FIG. 5A-shows the construction and operating state during a gradation selecting operation of a level shifter circuit in accordance with the second embodiment of the present invention.
FIG. 5B shows the operating state of the level shifter circuit during a gradation selecting operation.
Figures 6A, 6B:
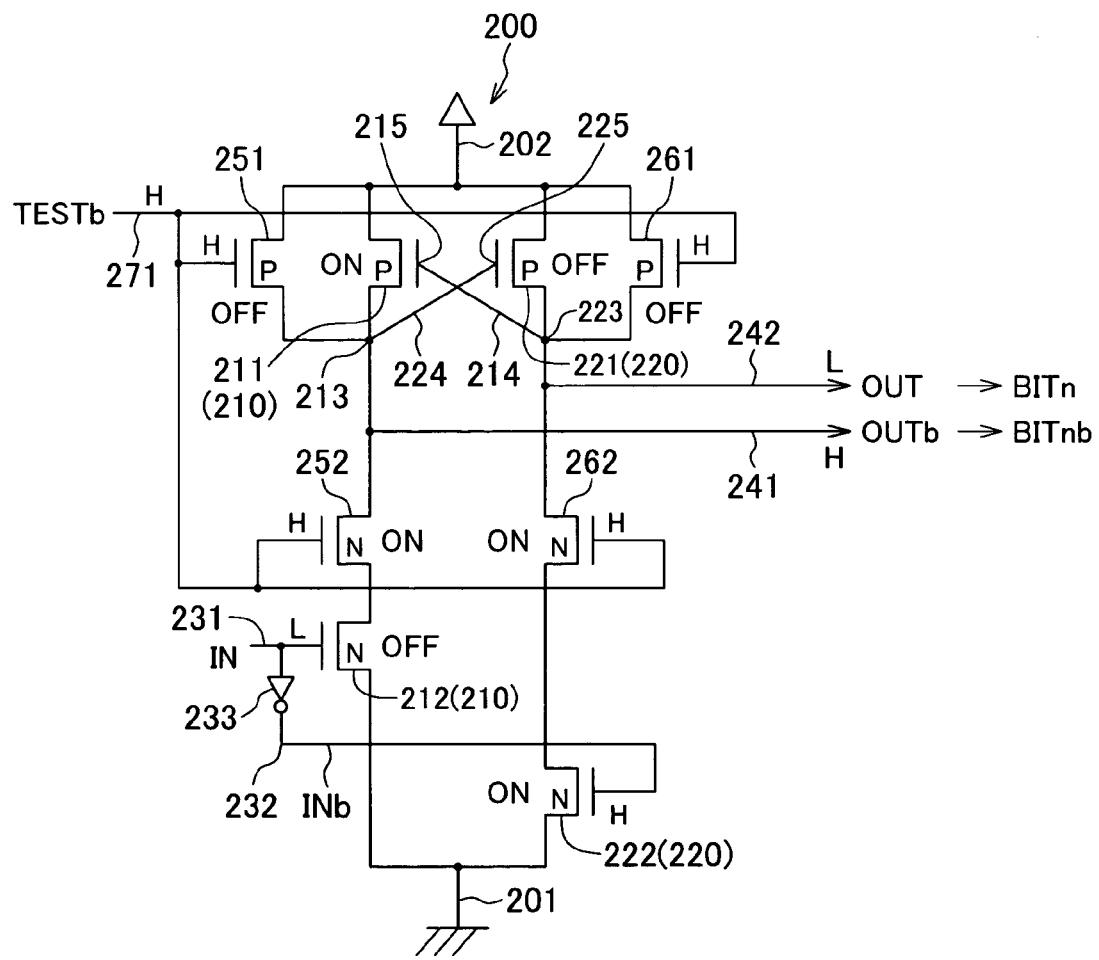
FIG. 6A shows the construction and operating state during a gradation selecting operation of a level shifter circuit in accordance with the second embodiment of the present invention.
FIG. 6B shows the operating state of the level shifter circuit during a gradation selecting operation.
Figures 7A, 7B:
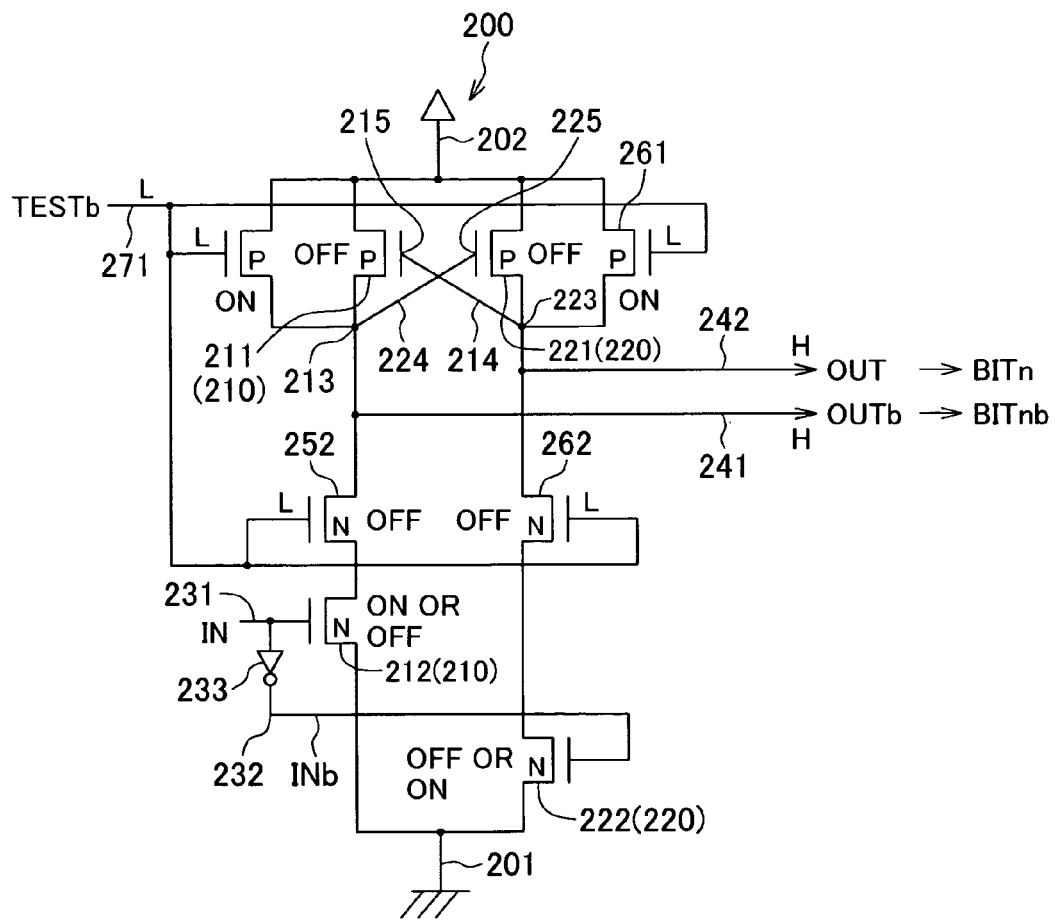
FIG. 7A shows the construction and operating state during a stress test of a level shifter circuit in accordance with the second embodiment of the present invention.
FIG. 7B shows the operating state of the level shifter circuit during a stress test.

FIG. 5A shows the construction and operating state during normal operation (during gradation selection operation) of a level shifter circuit 200 in accordance with the second embodiment of the present invention, and FIG. 5B shows the operating state during normal operation of the level shifter circuit 200. Further, FIG. 6A shows the construction and operating state during normal operation of the level shifter circuit 200 in accordance with the second embodiment of the present invention, and FIG. 6B shows the operating state during normal operation of the level shifter circuit 200. Furthermore, FIG. 7A shows the construction and operating state during a stress test of the level shifter circuit 200 in accordance with the second embodiment of the present invention, and FIG. 7B shows the operating state during the stress test of the level shifter circuit 200.

As shown in FIGS. 5A, 5B, 6A, 6B, 7A and 7B, the level shifter circuit 200 has a first reference potential supply line 201 to which a first reference potential (e.g., a ground potential GND) is applied, a second reference potential supply line 202 to which a second reference potential (e.g., a potential with a larger absolute value than the ground potential) different from the first reference potential is applied, a first output potential supply circuit 210 connected between the first reference potential supply line 201 and the second reference potential supply line 202, and a second output potential supply circuit 220 connected between the first reference potential supply line 201 and the second reference potential supply line 202 in parallel with the first output potential supply circuit 210. The first output potential supply circuit 210 has a first PMOS transistor 211 and first NMOS transistor 212 which are connected in series sequentially from the second reference potential supply line 202 side. The second output potential supply circuit 220 has a second PMOS transistor 221 and second NMOS transistor 222 which are connected in series sequentially from the second reference potential supply line 202 side.

The level shifter circuit 200 has a first connection line 214 which connects a gate 215 of the first PMOS transistor 211 with a source 223 of the second PMOS transistor 221 (i.e., a node between the second PMOS transistor 221 and the second NMOS transistor 222), and a second connection line 224 which connects a gate 125 of the second PMOS transistor 121 with a source 213 of the first PMOS transistor 211 (i.e., a node between the first PMOS transistor 211 and the second NMOS transistor 212).

The level shifter circuit 200 has a third PMOS transistor 251 connected in parallel with the first PMOS transistor 211, a fourth PMOS transistor 261 connected in parallel with the second PMOS transistor 221, a third NMOS transistor 252 connected between the first PMOS transistor 211 and the first NMOS transistor 212 in series, a fourth NMOS transistor 262 connected between the second PMOS transistor 221 and the second NMOS transistor 222 in series, and a test line 271 connected to the gate of the third PMOS transistor 251, the gate of the fourth PMOS transistor 261, the gate of the third NMOS transistor 252 and the gate of the fourth NMOS transistor 262, to which a test signal TESTb is applied. The third PMOS transistor 251, the fourth PMOS transistor 261, the third NMOS transistor 252, the fourth NMOS transistor 262 and the test line 271 form the stress test circuit in the level shifter circuit 200.

The level shifter circuit 200 has a first input line 231 connected with the gate of the first NMOS transistor 212, into which the first input signal IN is input, a second input line 232 connected with the gate of the second NMOS transistor 222, into which the second input signal INb which is the logical reverse of the first input signal IN is input, and an inverter 233 for generating the second input signal INb from the first input signal IN. The inverter 233 is not necessarily a part of the level shifter circuit 200, and may be a part of a control circuit, not shown, which supplies an input signal to the level shifter circuit 200. The level shifter circuit 200 also has a first output line 241 connected to the source 213 of the first PMOS transistor 211 (i.e., a node between the first PMOS transistor 211 and the first NMOS transistor 212), which outputs the first output signal OUTb, and a second output line 242 connected to the source 123 of the second PMOS transistor 212 (i.e., a node between the second PMOS transistor 221 and the NMOS transistor 222), which outputs the second output signal OUT.

As shown in FIGS. 5A, 5B, 6A and 6B, during normal operation, i.e., a gradation selection operation, the test signal TESTb is H level, the third PMOS transistor 251 is OFF, the fourth PMOS transistor 261 is OFF, the third NMOS transistor 252 is ON, and the fourth NMOS transistor 262 is ON.

As shown in FIGS. 5A and 5B, if the first input signal IN is set to H level, the second input signal INb will be L level. At this time, the first NMOS transistor 212 is ON, the node 213 is L level, and the second PMOS transistor 221 is ON. In addition, the second NMOS transistor 222 is OFF, the node 223 is H level, and the first PMOS transistor 215 is OFF. As a result, the first output signal OUTb of the first output line 241 connected to the node 213 is L level, and the second output signal OUT of the second output line 242 connected to the node 223 is H level.

As shown in FIGS. 6A and 6B, if the first input signal IN is set to L level, the second input signal INb will be H level. At this time, the first NMOS transistor 212 is OFF, the node 213 is H level, and the second PMOS transistor 221 is OFF. In addition, the second NMOS transistor 222 is ON, the node 223 is L level, and the first PMOS transistor 215 is ON. As a result, the first output signal OUTb of the first output line 241 connected to the node 213 is H level, and the second output signal OUT of the second output line 242 connected to the node 223 is L level.

As shown in FIGS. 7A and 7B, during a stress test, the test signal TESTb is L level, the third PMOS transistor 251 is ON, the fourth PMOS transistor 261 is ON, the third NMOS transistor 252 is OFF, and the fourth NMOS transistor 262 is OFF. As a result, both of the nodes 213 and 223 are H level. Therefore, the first output signal OUTb of the first output line 241 connected to the node 213 is H level, and the second output signal OUT of the second output line 242 connected to the node 223 is also H level.

When the gradation selection circuit 1 is formed from N-channel transistors, all the N-channel transistors of the gradation selection circuit 1 can be switched ON by performing the stress test shown in FIGS. 7A and 7B.

As described above, in the level shifter circuit 200 in accordance with the second embodiment, the drive circuit 2 in which this level shifter circuit 200 is installed, the display device in which this drive circuit 2 is installed, and the stress test method of the gradation selection circuit 1 performed using the level shifter circuit 200, all the transistors in the gradation selection circuit 1 subjected to the stress test can be simultaneously switched ON as in the case of the first embodiment, so a high voltage stress test can be performed efficiently as in the case of the first embodiment.

Third Embodiment

Figures 8A, 8B:
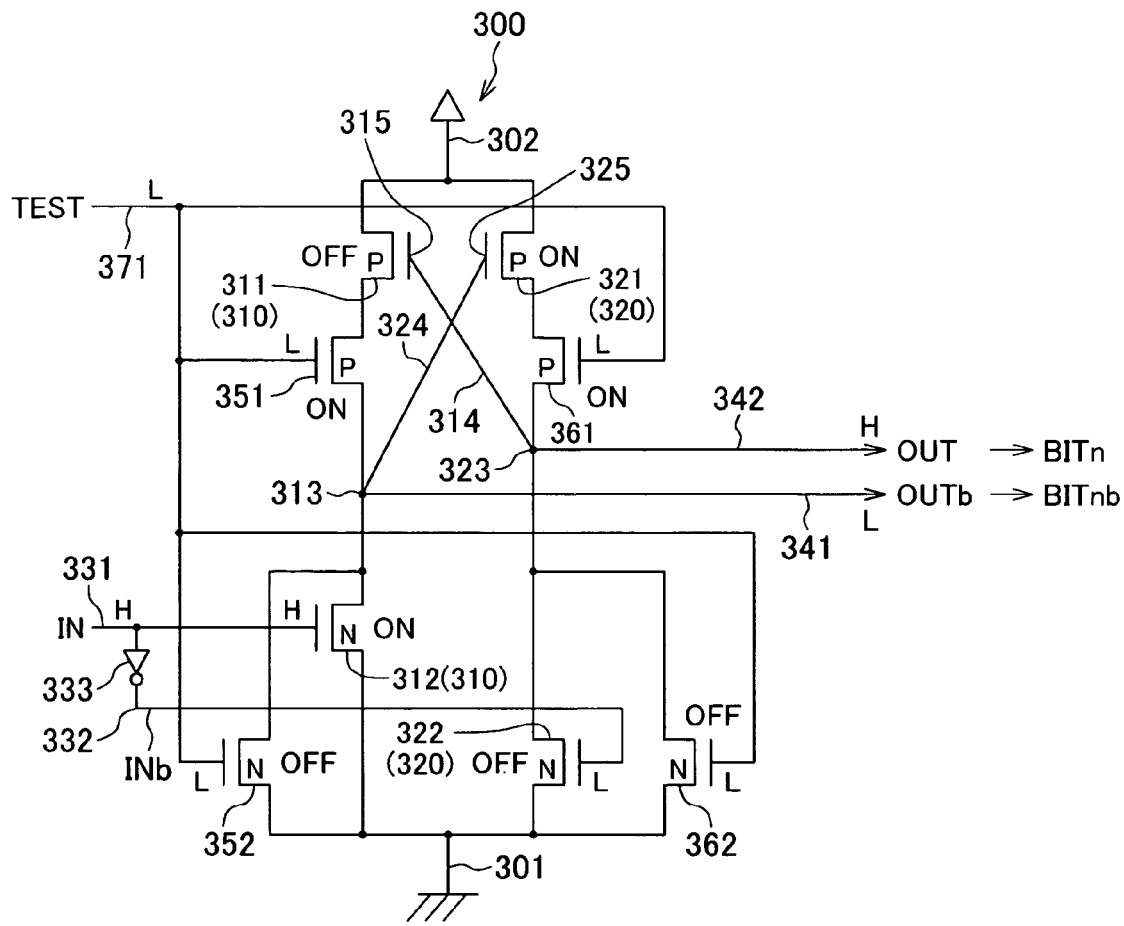
FIG. 8A shows the construction and operating state during a gradation selecting operation of a level shifter circuit in accordance with the third embodiment of the present invention.
FIG. 8B shows the operating state of the level shifter circuit during a gradation selecting operation.
Figures 9A, 9B:
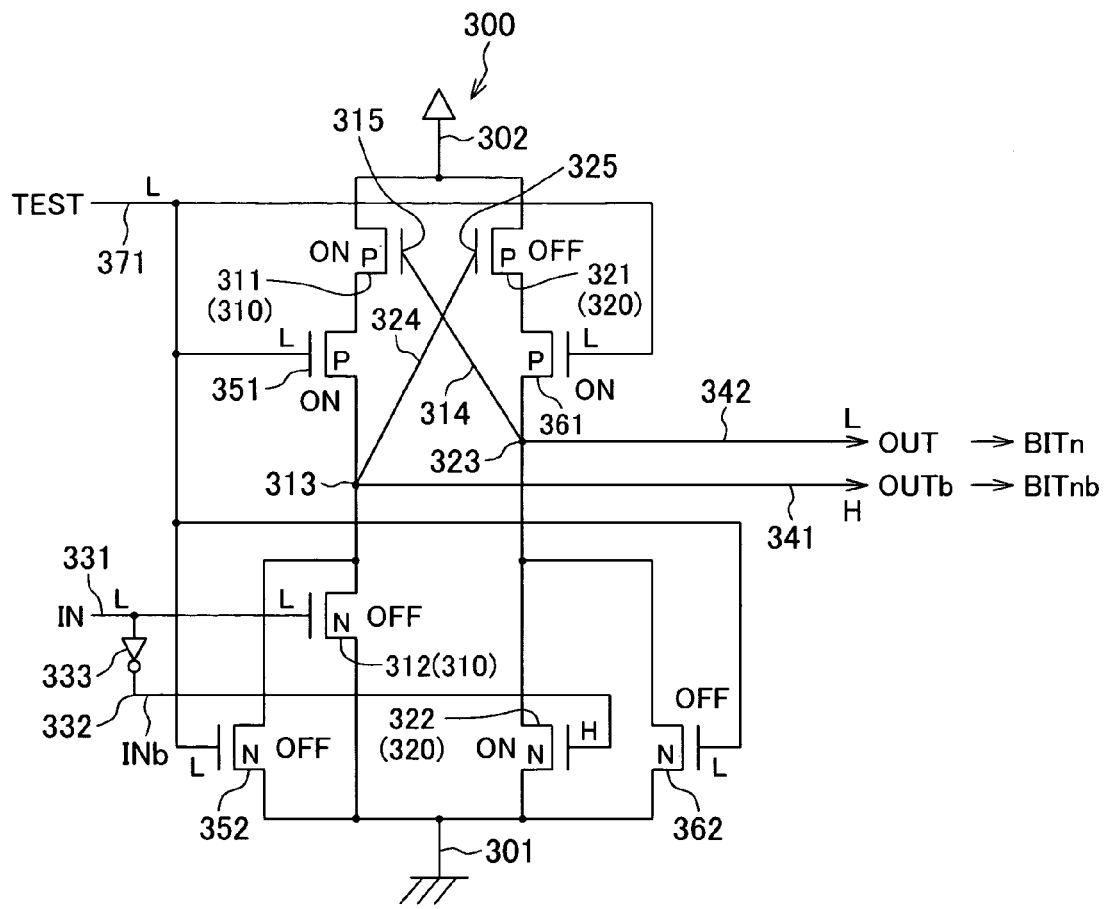
FIG. 9A shows the construction and operating state during a gradation selecting operation of a level shifter circuit in accordance with the third embodiment of the present invention.
FIG. 9B shows the operating state of the level shifter circuit during a gradation selecting operation.
Figures 10A, 10B:
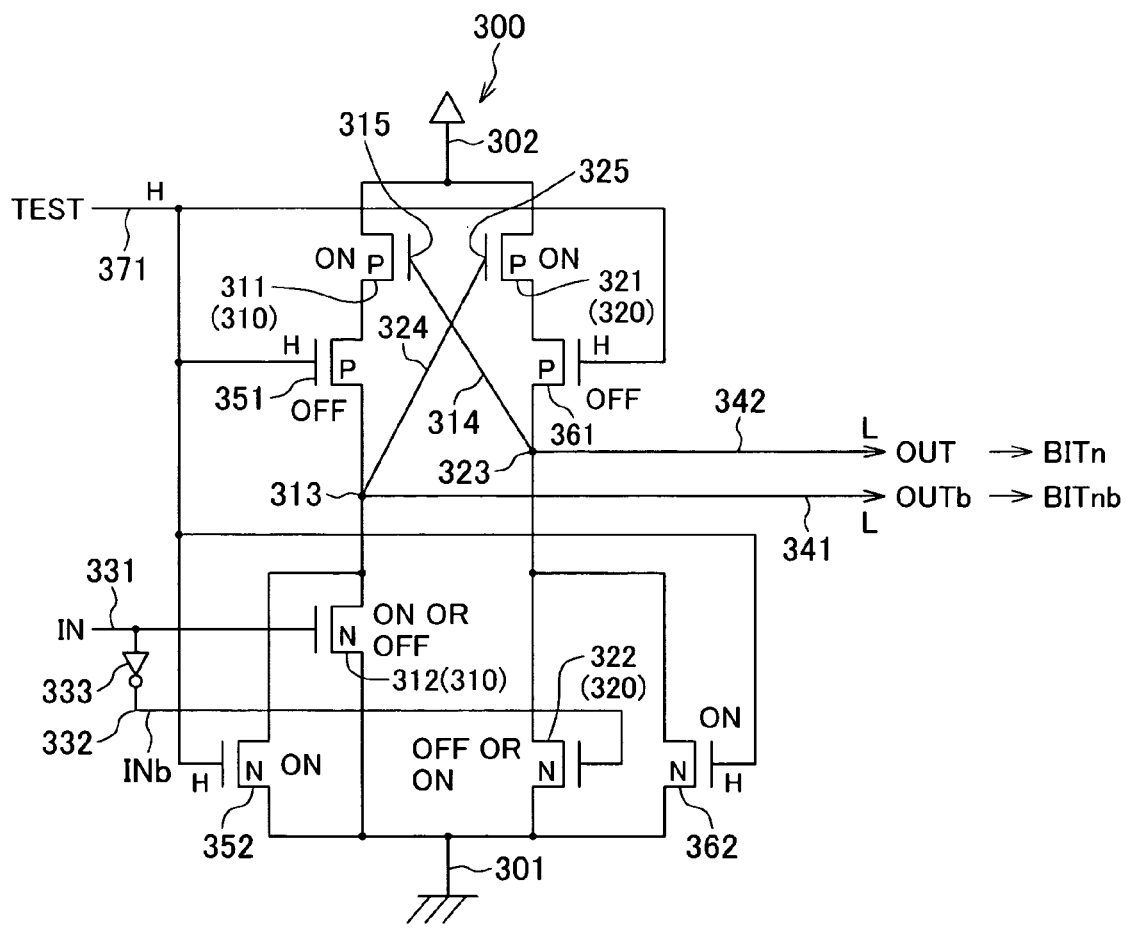
FIG. 10A shows the construction and operating state during a stress test of a level shifter circuit in accordance with the third embodiment of the present invention.
FIG. 10B shows the operating state of the level shifter circuit during a stress test.

FIG. 8A shows the construction and operating state during normal operation (i.e., during a gradation selection operation) of a level shifter circuit 300 in accordance with the third embodiment of the present invention, and FIG. 8B shows the operating state during normal operation of the level shifter circuit 300. Further, FIG. 9A shows the construction and operating state during normal operation of the level shifter circuit 300 in accordance with the third embodiment of the present invention, and FIG. 9B shows the operating state during normal operation of the level shifter circuit 300. Furthermore, FIG. 10A shows the construction and operating state during a stress test of the level shifter circuit 300 in accordance with the third embodiment of the present invention, and FIG. 10B shows the operating state during the stress test of the level shifter circuit 300.

As shown in FIGS. 8A, 8B, 9A, 9B, 10A and 10B, the level shifter circuit 300 has a first reference potential supply line 301 to which a first reference potential (e.g., a ground potential GND) is applied, a second reference potential supply line 302 to which a second reference potential (e.g., a potential with a larger absolute value than the ground potential) different from the first reference potential is applied, a first output potential supply circuit 310 connected between the first reference potential supply line 301 and the second reference potential supply line 302, and a second output potential supply circuit 320 connected between the first reference potential supply line 301 and the second reference potential supply line 302 in parallel with the first output potential supply circuit 310. The first output potential supply circuit 310 has a first PMOS transistor 311 and a first NMOS transistor 312 which are connected in series sequentially from the second reference potential supply line 302 side. The second output potential supply circuit 320 has a second PMOS transistor 321 and a second NMOS transistor 322 which are connected in series sequentially from the second reference potential supply line 302 side.

The level shifter circuit 300 has a first connection line 314 which connects the gate 315 of the first PMOS transistor 311 to the drain 323 of the second NMOS transistor 322 (i.e., a node between the second PMOS transistor 321 and the second NMOS transistor 322), and a second connection line 324 which connects the gate 325 of the second PMOS transistor 321 to the drain 313 of the first NMOS transistor 312 (i.e., a node between the first PMOS transistor 311 and the first NMOS transistor 313).

The level shifter circuit 300 has a third PMOS transistor 351 connected between the first PMOS transistor 311 and the first NMOS transistor 312 in series, a fourth PMOS transistor 361 connected between the second PMOS transistor 321 and the second NMOS transistor 322 in series, a third NMOS transistor 352 connected in parallel with the first NMOS transistor 312, a fourth NMOS transistor 362 connected in parallel with the second NMOS transistor 322, and a test line 371 connected to the gate of the third PMOS transistor 351, the gate of the fourth PMOS transistor 361, the gate of the third NMOS transistor 352 and the gate of the fourth NMOS transistor 362, to which a test signal TEST is applied. The third PMOS transistor 351, the fourth PMOS transistor 361, the third NMOS transistor 352, the fourth NMOS transistor 362 and the test line 371 form the stress test circuit in the level shifter circuit 300.

The level shifter circuit 300 has a first input line 331 connected to the gate of the first NMOS transistor 312 into which the first input signal IN is input, a second input line 332 connected to the gate of the second NMOS transistor 322 into which the second input signal INb which is the logical reverse of the first input signal IN is input, and an inverter 333 for generating the second input signal INb from the first input signal IN. The inverter 333 is not necessarily be a part of the level shifter circuit 300, and may be a part of a control circuit, not shown, which supplies an input signal to the level shifter circuit 300. The level shifter circuit 300 has a first output line 341 connected to the drain 313 of the first NMOS transistor 312 (i.e., a node between the first PMOS transistor 311 and the first NMOS transistor 312), which outputs the first output signal OUTb, and a second output line 342 connected to the drain 323 of the second NMOS transistor 322 (i.e., a node between the second PMOS transistor 321 and the second NMOS transistor 322), which outputs the second output signal OUT.

As shown in FIGS. 8A, 8B, 9A and 9B, during normal operation, i.e., a gradation selection operation, the test signal TEST is L level, the third PMOS transistor 351 is ON, the fourth PMOS transistor 361 is ON, the third NMOS transistor 352 is OFF, and the fourth NMOS transistor 362 is OFF.

As shown in FIGS. 8A and 8B, if the first input signal IN is set to H level, the second input signal INb will be L level. At this time, the first NMOS transistor 312 is ON, the node 313 is L level, and the second PMOS transistor 321 is ON. In addition, the second NMOS transistor 322 is OFF, the node 323 is H level, and the first PMOS transistor 315 is OFF. As a result, the first output signal OUTb of the first output line 341 connected to the node 313 is L level, and the second output signal OUT of the second output line 342 connected to the node 323 is H level.

As shown in FIGS. 9A and 9B, if the first input signal IN is set to L level, the second input signal INb will be H level. At this time, the first NMOS transistor 312 is OFF, the node 313 is H level, and the second PMOS transistor 321 is OFF. In addition, the second NMOS transistor 322 is ON, the node 323 is L level, and the first PMOS transistor 315 is ON. As a result, the first output signal OUTb of the first output line 341 connected to the node 313 is H level, and the second output signal OUT of the second output line 342 connected to the node 323 is L level.

As shown in FIGS. 10A and 10B, during a stress test, the test signal TEST is H level, the third PMOS transistor 351 is OFF, the fourth PMOS transistor 361 is OFF, the third NMOS transistor 352 is ON, and the fourth NMOS transistor 362 is ON. As a result, both of the nodes 313 and 323 are L level. Therefore, as shown in FIGS. 10A and 10B, the first output signal OUTb of the first output line 341 connected to the node 313 is L level, and the second output signal OUT of the second output line 342 connected to the node 323 is also L Level regardless of the input signals IN and INb.

When the gradation selection circuit 1 is formed from P-channel transistors, all the P-channel transistors of the gradation selection circuit 1 can be switched ON by performing the stress test shown in FIGS. 10A and 10B.

As described above, in the level shifter circuit 300 in accordance with the third embodiment, the drive circuit in which this level shifter circuit 300 is installed, the display device in which this drive circuit is installed, and the stress test method of the gradation selection circuit performed using the level shifter circuit 300, all the transistors in the gradation selection circuit subjected to the stress test can be simultaneously switched ON, so a high voltage stress test can be performed efficiently as in the case of the first and second embodiments.

Fourth Embodiment

Figures 11A, 11B:
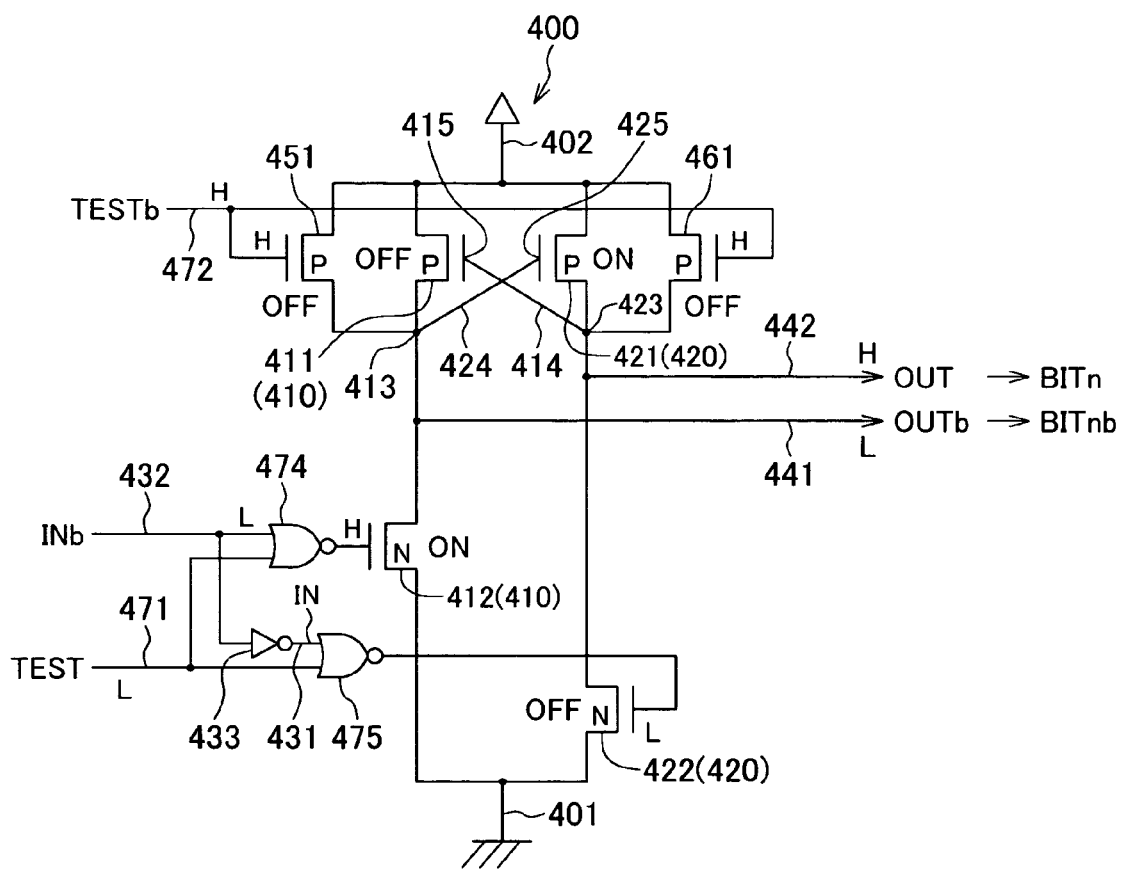
FIG. 11A shows the construction and operating state during a gradation selecting operation of a level shifter circuit in accordance with the fourth embodiment of the present invention.
FIG. 11B shows the operating state of the level shifter circuit during a gradation selecting operation.
Figures 12A, 12B:
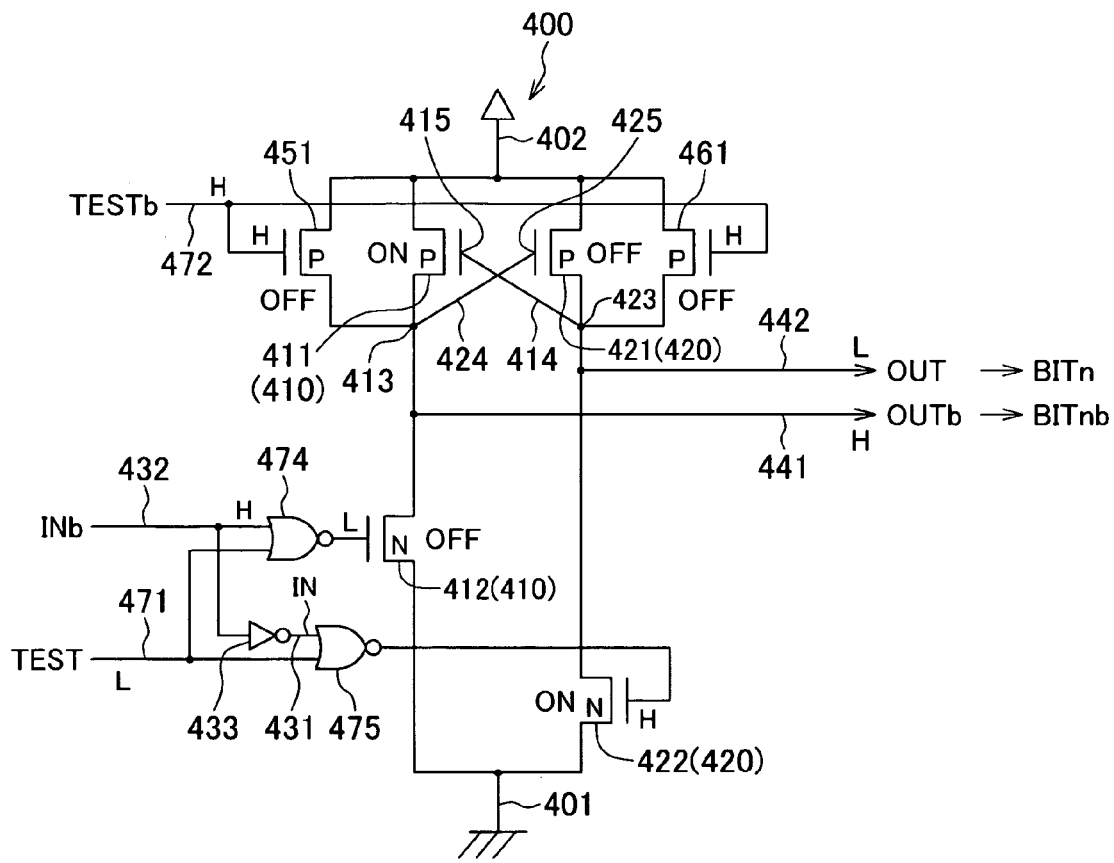
FIG. 12A shows the construction and operating state during a gradation selecting operation of a level shifter circuit in accordance with the fourth embodiment of the present invention.
FIG. 12B shows the operating state of the level shifter circuit during a gradation selecting operation.
Figures 13A, 13B:
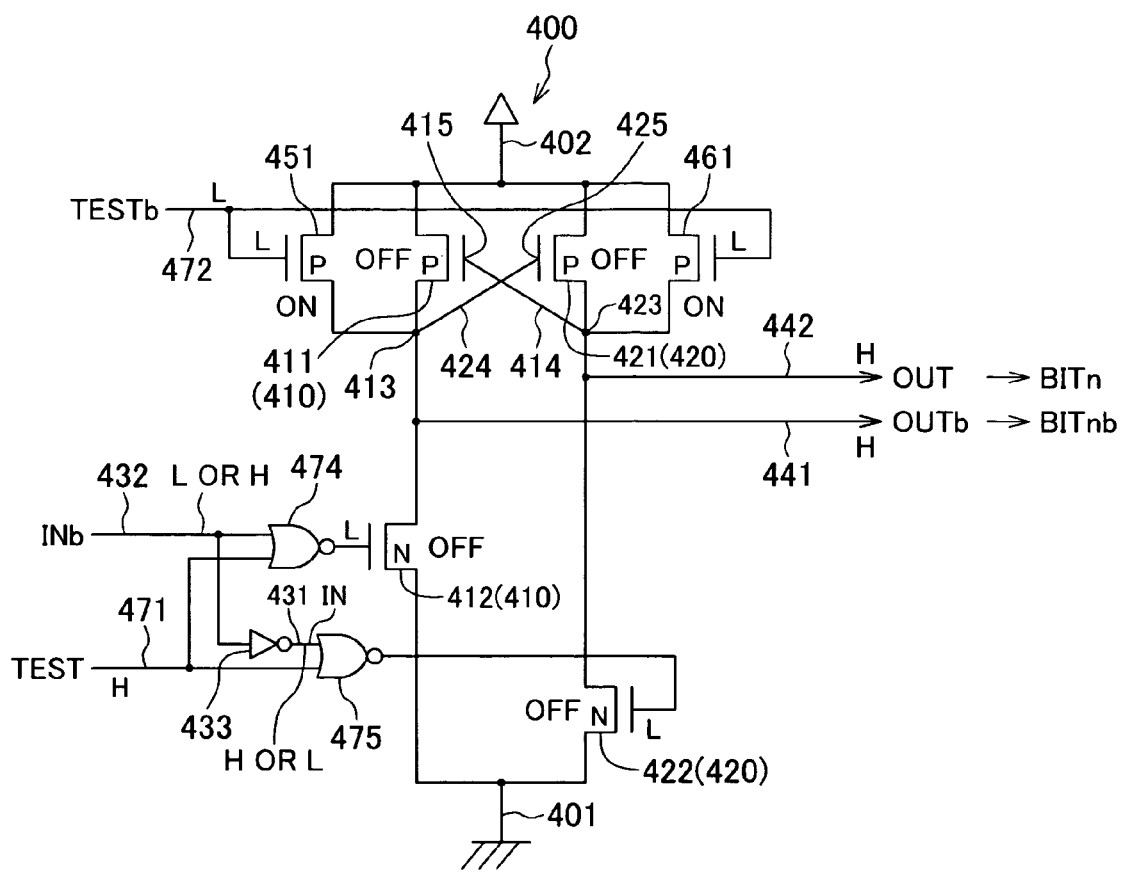
FIG. 13A shows the construction and operating state during a stress test of a level shifter circuit in accordance with the fourth embodiment of the present invention.
FIG. 13B shows the operating state of the level shifter circuit during a stress test.

FIG. 11A shows the construction and operating state during normal operation (during a gradation selection operation) of a level shifter circuit 400 in accordance with the fourth embodiment of the present invention, and FIG. 11B shows the operating state during normal operation of the level shifter circuit 400. Further, FIG. 12A shows the construction and operating state during normal operation of the level shifter circuit 400 in accordance with the fourth embodiment of the present invention, and FIG. 12B shows the operating state during normal operation of the level shifter circuit 400. Furthermore, FIG. 13A shows the construction and operating state during a stress test of the level shifter circuit 400 in accordance with the fourth embodiment of the present invention, and FIG. 13B shows the operating state during a stress test of the level shifter circuit 300.

As shown in FIGS. 11A, 11B, 12A, 12B, 13A and 13B, the level shifter circuit 400 has a first reference potential supply line 401 to which a first reference potential (e.g., a ground potential GND) is applied, a second reference potential supply line 402 to which a second reference potential (e.g., a potential with a larger absolute value than the ground potential) different from the first reference potential is applied, a first output potential supply circuit 410 connected between the first reference potential supply line 401 and the second reference potential supply line 402, and a second output potential supply circuit 420 connected between the first reference potential supply line 401 and the second reference potential supply line 402 in parallel with the first output potential supply circuit 410. The first output potential supply circuit 410 has a first PMOS transistor 411 and a first NMOS transistor 412 which are connected in series sequentially from the second reference potential supply line 402 side. The second output potential supply circuit 420 has a second PMOS transistor 421 and a second NMOS transistor 422 which are connected in series sequentially from the second reference potential supply line 402 side.

The level shifter circuit 400 has a first connection line 414 which connects a gate 415 of the first PMOS transistor 411 to a source 423 of the second PMOS transistor 422 (i.e., a node between the second PMOS transistor 421 and the second NMOS transistor 422), and a second connection line 424 which connects a gate 425 of the second PMOS transistor 421 to a source 413 of the first PMOS transistor 412 (i.e., a node between the first PMOS transistor 411 and the second NMOS transistor 422).

The level shifter circuit 400 has a third PMOS transistor 451 connected to the first PMOS transistor 411 in parallel, and a fourth PMOS transistor 461 connected to the second PMOS transistor 421. The level shifter circuit 400 also has a first test line 471 into which the test signal TEST is input, a second test line 472 into which the test signal TESTb which is the logical reverse of the test signal TEST is input, and two input NOR circuits 474 and 475. The input signal INb and the test signal TEST are input into the NOR circuit 474, and the output of the NOR circuit 474 is input to the gate of the first NMOS transistor 412. The input signal IN and the test signal TEST are input to the NOR circuit 475, and the output of the NOR circuit 475 is input to the gate of the second NMOS transistor 422. The first transistor 471, the second transistor 472, and the NOR circuits 474 and 475 form a drive control circuit which controls ON/OFF of the first NMOS transistor 412, the second NMOS transistor 422, the third PMOS transistor 451 and the fourth PMOS transistor 461.

The level shifter circuit 400 has a first input line 431 connected to the gate of the first NMOS transistor 412 into which the first input signal IN is input, a second input line 432 connected to the gate of the second NMOS transistor 422 into which the second input signal INb which is the logical reverse of the first input signal IN is input, and an inverter 433 for generating the second input signal INb from the first input signal IN. The inverter 433 is not necessarily a part of the level shifter circuit 400, and may be a part of a control circuit, not shown, which supplies an input signal to the level shifter circuit 400. The level shifter circuit 400 has a first output line 441 connected to the source 413 of the first PMOS transistor 411 (i.e., a node between the first PMOS transistor 411 and the first NMOS transistor 412), which outputs the first output signal OUTb, and a second output line 442 connected to the source 423 of the second PMOS transistor 412 (i.e., a node between the second PMOS transistor 421 and the second NMOS transistor 422), which outputs the second output signal OUT.

As shown in FIGS. 11A, 11B, 12A and 12B, during normal operation, i.e., a gradation selection operation, the test signal TEST is L level, the test signal TESTb is H level, the third PMOS transistor 451 is OFF, and the fourth PMOS transistor 461 is OFF.

As shown in FIGS. 11A and 11B, if the second input signal INb is set to L level and the first input signal IN is set to H level, the NOR circuit 474 outputs H level, the first NMOS transistor 412 is ON, the NOR circuit 475 outputs L level, and the second NMOS transistor 422 is OFF. As a result, the node 413 is L level and the second PMOS transistor 421 is ON. Also, as the second input signal INb is L level, the second NMOS transistor 422 is OFF, the second PMOS transistor 421 is ON, the node 423 is H level, and the first PMOS transistor 415 is OFF. Therefore, the first output signal OUTb of the first output line 441 connected to the node 413 is L level, and the output signal OUT of the second output line 442 connected to the node 423 is H level.

As shown in FIGS. 12A and 12B, if the second input signal INb is set to H level, and the first input signal IN is set to L level, the NOR circuit 474 outputs L level, the first NMOS transistor 412 is OFF, the NOR circuit 475 outputs H level, and the second NMOS transistor 422 is ON. As a result, the node 413 is H level and the second PMOS transistor 421 is OFF. Also, as the second input signal INb is H level, the second NMOS transistor 422 is ON, the second PMOS transistor 421 is OFF, the node 423 is L level, and the first PMOS transistor 415 is ON. Therefore, the first output signal OUTb of the first output line 441 connected to the node 413 is H level, and the output signal OUT of the second output line 442 connected to the node 423 is L level.

As shown in FIGS. 13A and 13B, during a stress test, the test signal TEST is H level, the test signal TESTb is L level, the third PMOS transistor 451 is ON, and the fourth PMOS transistor 461 is also ON. As a result, the node 413 is H level and the node 423 is also H level. Therefore, the first output signal OUTb of the first output line 441 connected to the node 413 is H level, and the second output signal OUT of the second output line 442 connected to the node 423 is also H Level.

When the gradation selection circuit 1 is formed from N-channel transistors, all the N-channel transistors of the gradation selection circuit 1 can be switched ON by performing the stress test shown in FIGS. 13A and 13B.

As described above, in the level shifter circuit 400 in accordance with the fourth embodiment, the drive circuit in which this level shifter circuit 400 is installed, the display device in which this drive circuit is installed, and the stress test method of the gradation selection circuit performed using the level shifter circuit 400, all the transistors in the gradation selection circuit subjected to the stress test can be simultaneously switched ON, so a high voltage stress test can be performed efficiently as in the case of the first to third embodiments.

In the level shifter circuit 400 in accordance with the fourth embodiment, the layout area of the circuit can be made small. This is due to the following two reasons. The first reason is as follows. Test circuit control on the NMOS transistor side having a small voltage amplitude (i.e., voltage amplitude of gate input of NMOS transistor) is performed at low voltage amplitude (test signal TEST), and test circuit control on the PMOS transistor side having a large voltage amplitude is performed at high voltage amplitude (test signal TESTb). Hence, due to performing logic control on the low voltage side, it is possible to form a circuit layout of small area rather than form the circuit from high voltage transistors having a large layout area. The second reason is as follows. As the gate voltage on the input side (the transistor, e.g., NMOS transistor, which inputs the input signal IN or INb as the gate signal) of the level shifter circuit has a smaller voltage amplitude than the source-drain amplitude of the high voltage transistors, large dimensions (gate amplitude) are required to ensure a sufficient source-drain current Ids. Therefore, if a construction were adopted wherein low voltage amplitude transistors were connected in series to realize the level shifter circuit of the fourth embodiment, resistance components would be doubled due to the series connection, so the transistors would require approximately twice the gate amplitude (i.e., requiring an increase in the source-drain current Ids of the transistors by two times).

Fifth Embodiment

Figures 14A, 14B:
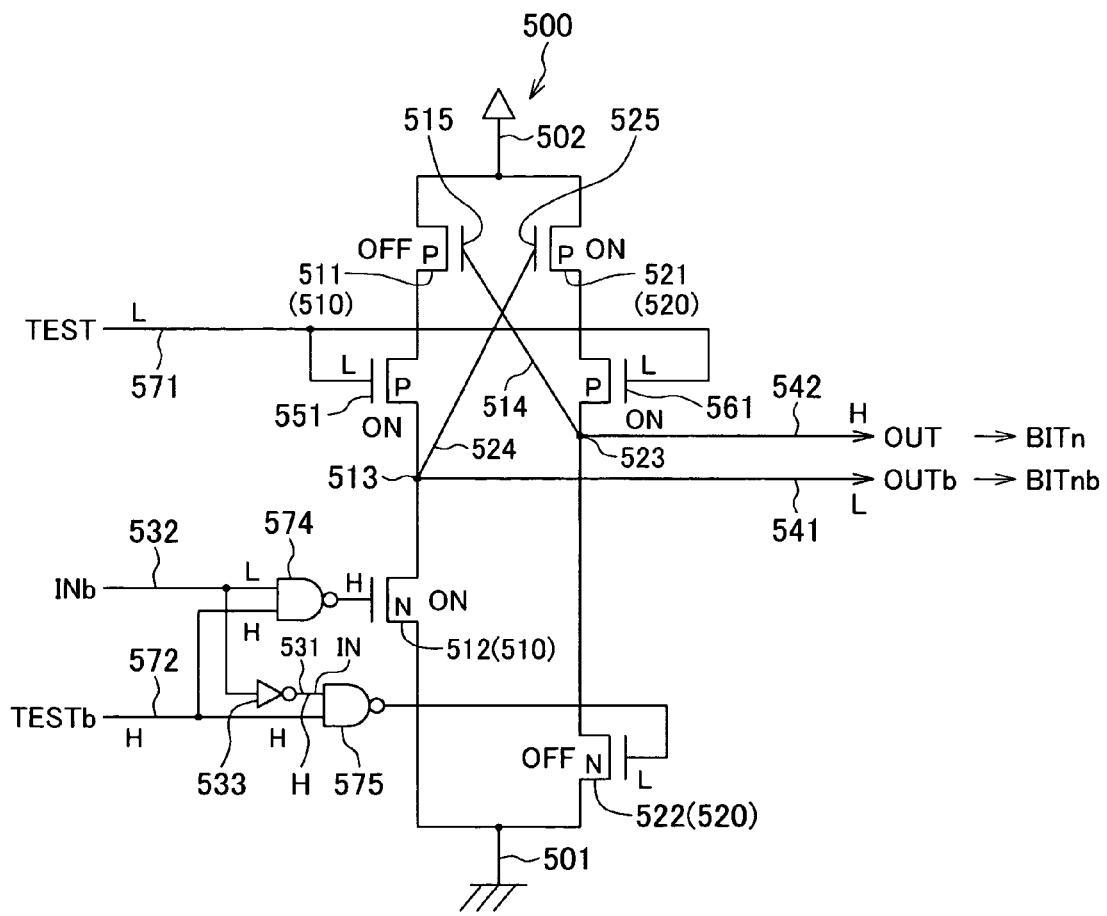
FIG. 14A shows the construction and operating state during a gradation selecting operation of a level shifter circuit in accordance with the fifth embodiment of the present invention.
FIG. 14B shows the operating state of the level shifter circuit during a gradation selecting operation.
Figures 15A, 15B:
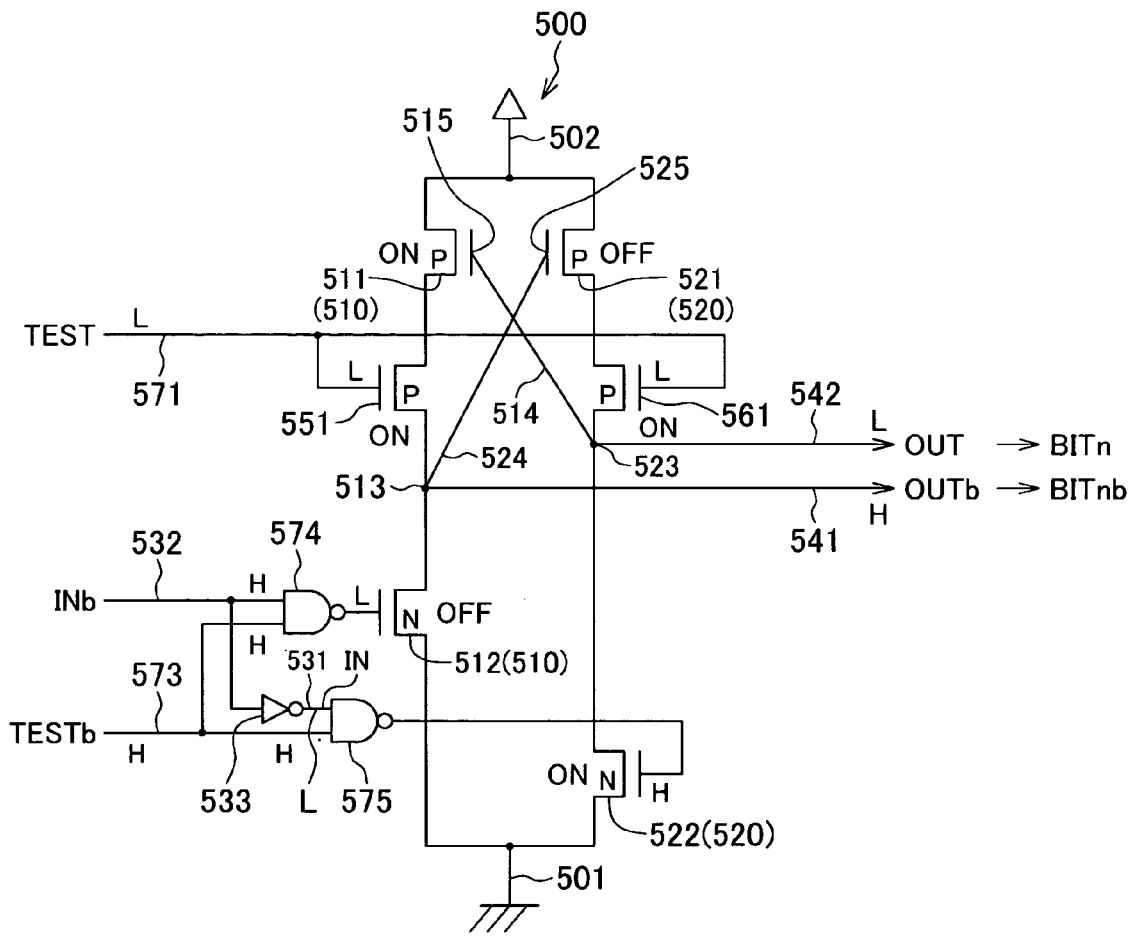
FIG. 15A shows the construction and operating state during a gradation selecting operation of a level shifter circuit in accordance with the fifth embodiment of the present invention.
FIG. 15B shows the operating state of the level shifter circuit during a gradation selecting operation.

FIG. 14A shows the construction and operating state during normal operation (i.e., during a gradation selection operation) of a level shifter circuit 500 in accordance with the fifth embodiment of the present invention, and FIG. 14B shows the operating state during normal operation of the level shifter circuit 500. Further, FIG. 15A shows the construction and operating state during normal operation of the level shifter circuit 500 in accordance with the fifth embodiment of the present invention, and FIG. 15B shows the operating state during normal operation of the level shifter circuit 500. Furthermore, FIG. 15A shows the construction and operating state during a stress test of the level shifter circuit 500 in accordance with the fifth embodiment of the present invention, and FIG. 15B shows the operating state during a stress test of the level shifter circuit 500.

As shown in FIGS. 14A, 14B, 15A, 15B, 16A and 16B, the level shifter circuit 500 has a first reference potential supply line 501 to which a first reference potential (e.g., a ground potential GND) is applied, a second reference potential supply line 502 to which a second reference potential (e.g., a potential with a larger absolute value than the ground potential) different from the first reference potential is applied, a first output potential supply circuit 510 connected between the first reference potential supply line 501 and the second reference potential supply line 502, and a second output potential supply circuit 520 connected between the first reference potential supply line 501 and the second reference potential supply line 502 in parallel with the first output potential supply circuit 510. The first output potential supply circuit 510 has a first PMOS transistor 511 and a first NMOS transistor 512, which are connected in series sequentially from the second reference potential supply line 502 side. The second output potential supply circuit 520 has a second PMOS transistor 521 and a second NMOS transistor 522, which are connected in series sequentially from the second reference potential supply line 502 side.

The level shifter circuit 500 has a first connection line 514 which connects a gate 515 of the first PMOS transistor 511 to a drain 523 of the second PMOS transistor 522 (i.e., a node between the second PMOS transistor 521 and the second NMOS transistor 522), and a second connection line 524 which connects a gate 525 of the second PMOS transistor 521 to a drain 513 of the first PMOS transistor 512 (i.e., a node between the first PMOS transistor 511 and the first NMOS transistor 512).

The level shifter circuit 500 has a third PMOS transistor 551 connected between the first PMOS transistor 511 and the first NMOS transistor 512 in parallel, and a fourth PMOS transistor 561 connected between the second PMOS transistor 521 and the second NMOS transistor 522 in parallel. The level shifter circuit 500 also has a first test line 571 into which the test signal TEST is input, a second test line 572 into which the test signal TESTb which is the logical reverse of the test signal TEST is input, and two-input NAND circuits 574 and 575. The input signal INb and the test signal TEST are input into the NAND circuit 574, and the output of the NAND circuit 574 is input to the gate of the first NMOS transistor 512. The input signal IN and the test signal TEST are input to the NAND circuit 575, and the output of the NAND circuit 575 is input to the gate of the second NMOS transistor 522. The first transistor 571, the second transistor 572, and the NAND circuits 574 and 575, form a drive control circuit which controls ON/OFF of the first NMOS transistor 512, the second NMOS transistor 522, the third PMOS transistor 551 and the fourth PMOS transistor 561.

The level shifter circuit 500 has a first input line 531 connected to the gate of the first NMOS transistor 512 into which the first input signal IN is input, a second input line 532 connected to the gate of the second NMOS transistor 522 into which the second input signal INb which is the logical reverse of the first input signal IN is input, and an inverter 533 for generating the second input signal INb from the first input signal IN. The inverter 533 is not necessarily a part of the level shifter circuit 500, and may be a part of a control circuit, not shown, which supplies an input signal to the level shifter circuit 500. The level shifter circuit 500 has a first output line 541 connected to the drain 513 of the first NMOS transistor 512 (i.e., a node between the first PMOS transistor 511 and first NMOS transistor 512), which outputs the first output signal OUTb, and a second output line 542 connected to the drain 523 of the second NMOS transistor 522 (i.e., a node between the second PMOS transistor 521 and second NMOS transistor 522), which outputs the second output signal OUT.

As shown in FIGS. 14A, 14B, 15A and 15B, during normal operation, i.e., a gradation selection operation, the test signal TEST is L level, the test signal TESTb is H level, the third PMOS transistor 551 is OFF, and the fourth PMOS transistor 561 is OFF.

As shown in FIGS. 14A and 14B, if the second input signal INb is set to L level and the first input signal IN is set to H level, the NAND circuit 574 outputs H level, the first NMOS transistor 512 is ON, the NAND circuit 575 outputs L level, and the second NMOS transistor 522 is OFF. As a result, the node 513 is L level and the second PMOS transistor 521 is ON. Also, the second NMOS transistor 522 is OFF, the second PMOS transistor 521 is ON, the node 523 is H level, and the first PMOS transistor 515 is OFF. Therefore, the first output signal OUTb of the first output line 541 connected to the node 513 is L level, and the output signal OUT of the second output line 542 connected to the node 523 is H level.

As shown in FIGS. 15A and 15B, if the second input signal INb is set to H level, and the first input signal IN is set to L level, the NAND circuit 574 outputs L level, the first NMOS transistor 512 is OFF, the NAND circuit 575 outputs H level, and the second NMOS transistor 522 is ON. As a result, the node 513 is H level and the second PMOS transistor 521 is OFF. Also, the second NMOS transistor 522 is ON, the second PMOS transistor 521 is OFF, the node 523 is L level, and the first PMOS transistor 515 is ON. Therefore, the first output signal OUTb of the first output line 541 connected to the node 513 is H level, and the output signal OUT of the second output line 542 connected to the node 523 is L level.

Figures 16A, 16B:
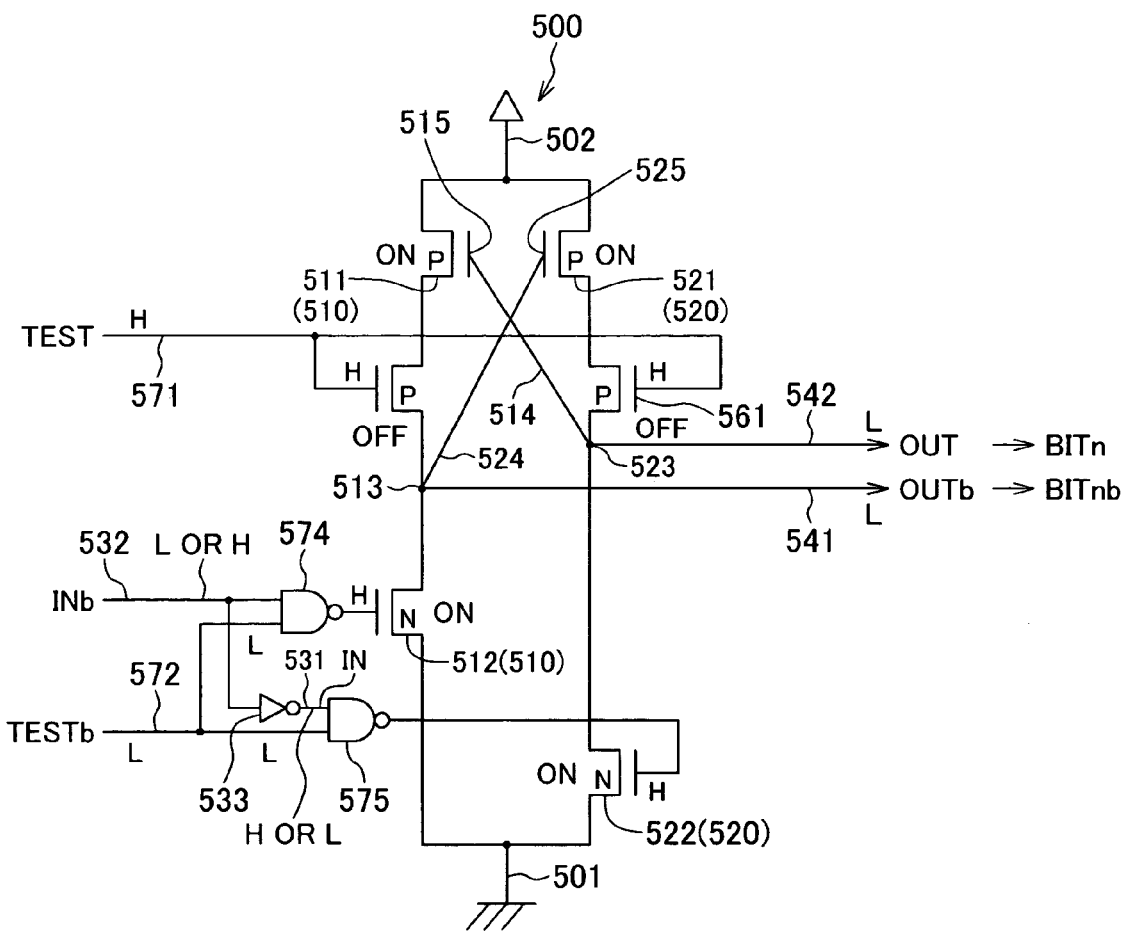
FIG. 16A shows the construction and operating state during a stress test of a level shifter circuit in accordance with the fifth embodiment of the present invention.
FIG. 16B shows the operating state of the level shifter circuit during a stress test.
Figure 17A:
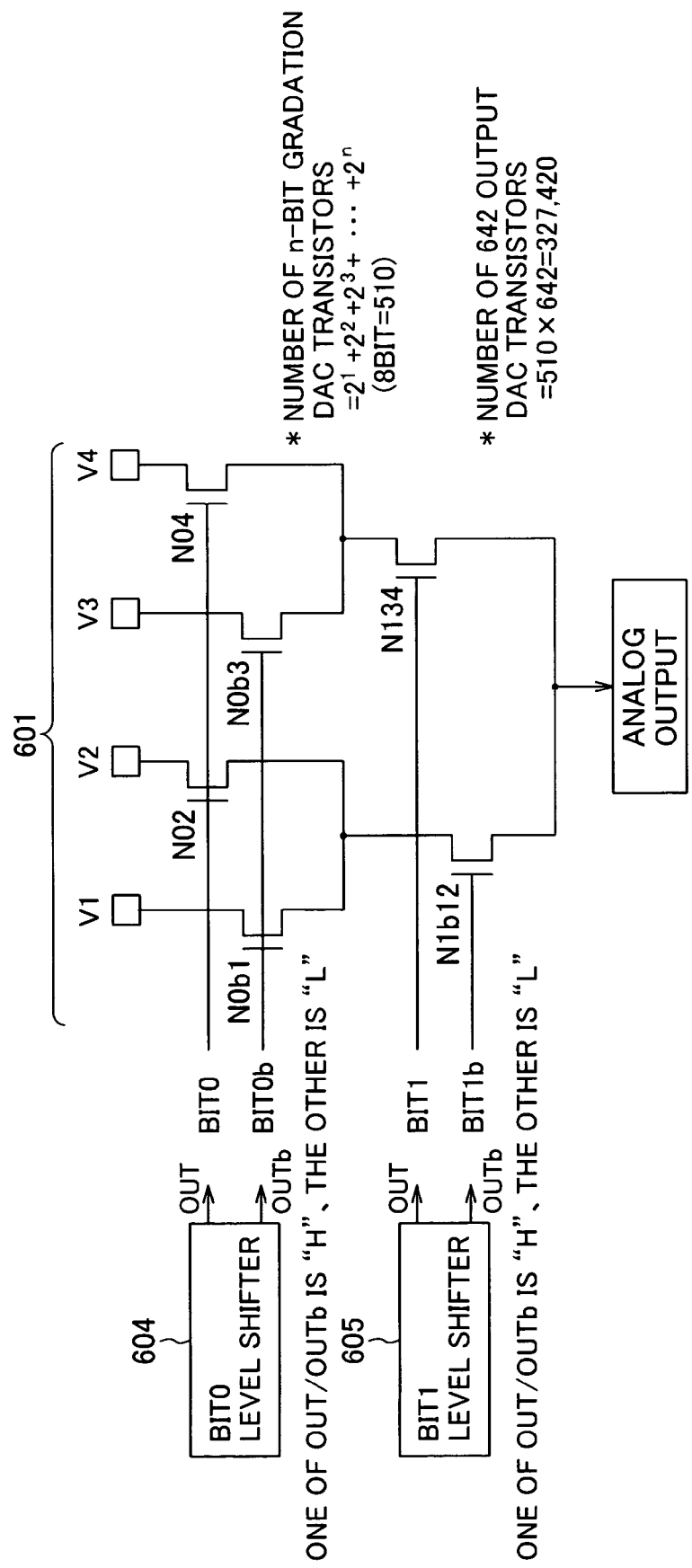
FIG. 17A shows prior-art level shifter circuits and a gradation selection circuit as an object of a stress test.
Figures 18A, 18B:
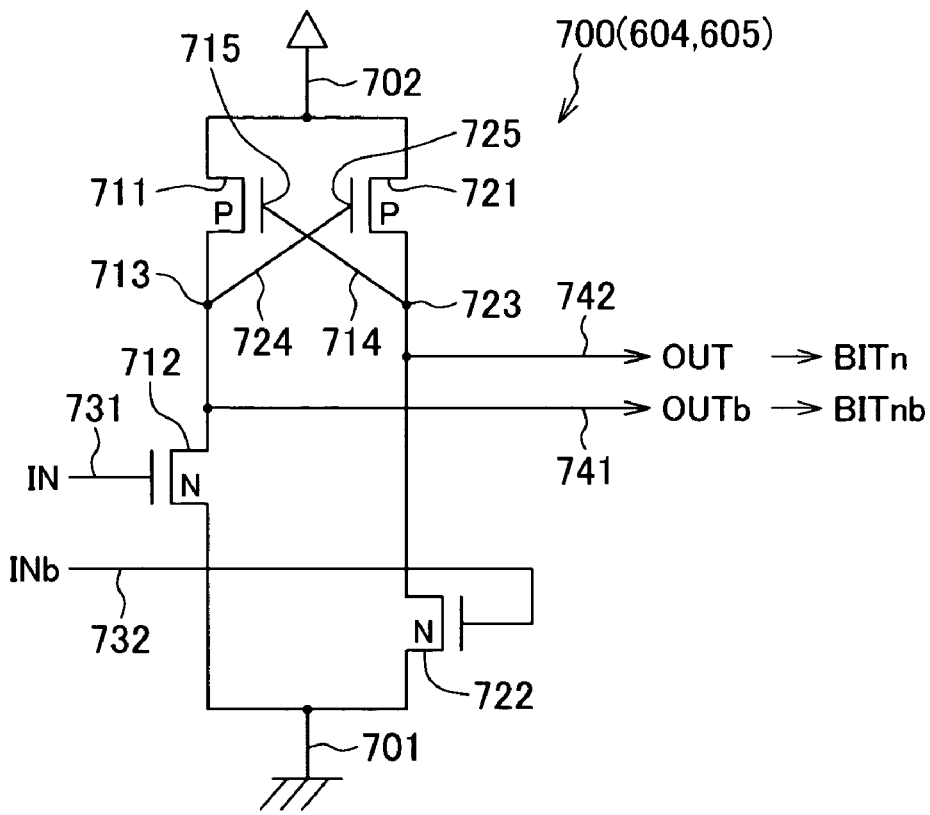
FIG. 18A shows the construction of the prior-art level shifter circuit.
FIG. 18B shows the operating state of the prior-art level shifter circuit.

As shown in FIGS. 16A and 16B, during a stress test, the test signal TEST is H level, the test signal TESTb is L level, the third PMOS transistor 551 is ON, and the fourth PMOS transistor 561 is also ON. As a result, the node 513 is H level and the node 523 is also H level. Therefore, the first output signal OUTb of the first output line 541 connected to the node 513 is H level, and the second output signal OUT of the second output line 542 connected to the node 523 is also H Level.

When the gradation selection circuit 1 is formed from P-channel transistor, all the P-channel transistors of the gradation selection circuit 1 can be switched ON by performing the stress test shown in FIGS. 16A and 16B.

As described above, in the level shifter circuit 500 in accordance with the fifth embodiment, the drive circuit in which this level shifter circuit 500 is installed, the display device in which this drive circuit is installed, and the stress test method of the gradation selection circuit performed using the level shifter circuit 500, all the transistors in the gradation selection circuit subjected to the stress test can be simultaneously switched ON, so a high voltage stress test can be performed efficiently as in the case of the first to fourth embodiments. Further, in the fifth embodiment, the layout area can be reduced as in the fourth embodiment.

In the above description, the case was described where the first output potential supply circuit 110, 210, 310, 410 or 510 was formed from one PMOS transistor 111, 211, 311, 411 or 511 and one NMOS transistor 112, 212, 312, 412 or 512, and the second output potential supply circuit 120, 220, 320, 420 or 520 was formed from one PMOS transistor 121, 221, 321, 421 or 521 and one NMOS transistor 122, 222, 322, 422 or 522, but the first output potential supply circuit 110, 210, 310, 410 or 510 and second output potential supply circuit 120, 220, 320, 420 or 520 may also be formed from another circuit having an identical function.

Also, in the aforesaid embodiments, an example was described of a circuit which selects a voltage gradation by a DAC circuit, but the present invention may be applied also to a multiplex circuit which selects one of plural signal lines.

The invention being thus described, it will be obvious that the same may be varied in many ways. Such variations are not to be regarded as a departure from the spirit and scope of the invention, and all such modifications as would be obvious to one skilled in the art are intended to be included within the scope of following claims.

What is claimed is:

1. A level shifter circuit, wherein a circuit which turns on when a first reference potential is input as a control potential is used as a first-type switching circuit, and a circuit which turns on when a second reference potential different from the first reference potential is input, is used as a second-type switching circuit, the level shifter circuit comprising:

a first reference potential supply line to which a first reference potential is applied;

a second reference potential supply line to which a second reference potential different from the first reference potential is applied;

a first output potential supply circuit including a first first-type switching circuit and a first second-type switching circuit connected sequentially in series from the second reference potential supply line side, the first output potential supply circuit being connected between the first reference potential supply line and the second reference potential supply line;

a second output potential supply circuit including a second first-type switching circuit and a second second-type switching circuit connected sequentially in series from the second reference potential supply line side, the second output potential supply circuit being connected between the first reference potential supply line and the second reference potential supply line, the second output potential supply circuit being connected in parallel with the first output potential supply circuit between the first reference potential supply line and the second reference potential supply line;

a first connection line which supplies a potential between the second first-type switching circuit and the second second-type switching circuit to a control terminal of the first first-type switching circuit;

a second connection line which supplies a potential between the first first-type switching circuit and the first second-type switching circuit to a control terminal of the second first-type switching circuit;

a first input line which supplies a first input signal to a control terminal of the first second-type switching circuit;

a second input line which supplies a second input signal to a control terminal of the second second-type switching circuit;

a first output line which outputs a potential between the first first-type switching circuit and the first second-type switching circuit as a first output signal;

a second output line which outputs a potential between the second first-type switching circuit and the second second-type switching circuit as a second output signal; and a stress test circuit which changes over the first output signal and the second output signal output to a controlled circuit from the first output line and the second output line, to any of signals when the controlled circuit is operating normally and signals when the controlled circuit is subjected to a stress test;

wherein the stress test circuit functions to:

during normal operation, when the first input signal and the second input signal having respectively different potentials are input to the first input line and the second input line, output the first output signal and the second output signal having respectively different potentials for the first output line and the second output line, and during the stress test, when the first input signal and the second input signal having respectively different potentials are input to the first input line and the second input line, output the first output signal and the second output signal having identical potentials from the first output line and the second output line;

wherein the stress test circuit includes:

a third first-type switching circuit connected in parallel with the first first-type switching circuit;

a fourth first-type switching circuit connected in parallel with the second first-type switching circuit; and a drive control circuit which receives the first and second input signals and a test signal, the drive control circuit controlling ON/OFF switching of the first second-type switching circuit and the second second-type switching circuit in accordance with the first and second input signals and the test signal, the drive control circuit controlling ON/OFF switching of the third first-type switching circuit and the fourth first-type switching circuit in accordance with the test signal;

wherein the drive control circuit:

during normal operation, switches both the third first-type switching circuit and the fourth first-type switching circuit OFF, and switches of the first second-type switching circuit and the second second-type switching circuit ON and the other OFF; and during the stress test, switches both of the third first-type switching circuit and the fourth first-type switching circuit ON, and both of the first second-type switching circuit and the second second-type switching circuit OFF.

2. The level shifter circuit according to claim 1, wherein:
the first reference potential is a ground potential;
the second reference potential is a potential higher than the ground potential;
the first-type switching circuit is a P-channel transistor; and
the second-type switching circuit is an N-channel transistor.

3. A drive circuit of a display device, comprising:
a level shifter circuit according to claim 1; and
a gradation selection circuit which functions as a controlled circuit;
wherein the gradation selection circuit has plural transistors which are switched ON or OFF according to the first output signal and the second output signal output from the level shifter circuit, into which plural gradation potentials are input, and one of the plural gradation potentials is selected depending on the ON/OFF states of the plural transistors.

4. A display device comprising:
a drive circuit according to claim 3; and
a display panel whereof gradation is controlled using a gradation potential output from the drive circuit.

5. A method of performing a stress test for a gradation selection circuit using a level shifter circuit, the level shifter circuit and the gradation selection circuit being incorporated in a drive circuit according to claim 3, the method comprising:
connecting the first input line and the second input line of the level shifter circuit to external potential supply lines respectively; and
inputting the first input signal and the second input signal having respectively different potentials to the first input line and the second input line of the level shifter circuit, thereby outputting the first output signal and the second output signal having identical potentials from the first output line and the second output line of the level shifter circuit to the gradation selection circuit.

* * * * *